US011488867B2

(12) United States Patent
Harada et al.

(10) Patent No.: US 11,488,867 B2
(45) Date of Patent: Nov. 1, 2022

(54) CHIP SINGULATION METHOD

(71) Applicant: Nuvoton Technology Corporation Japan, Kyoto (JP)

(72) Inventors: Takeshi Harada, Kagoshima (JP); Hiroaki Ohta, Osaka (JP); Yoshihiro Matsushima, Shiga (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/722,993

(22) Filed: Apr. 18, 2022

(65) Prior Publication Data

US 2022/0238378 A1 Jul. 28, 2022

Related U.S. Application Data

(63) Continuation of application No. PCT/JP2021/005957, filed on Feb. 17, 2021.
(Continued)

(51) Int. Cl.
*H01L 21/78* (2006.01)
*H01L 21/268* (2006.01)

(52) U.S. Cl.
CPC ........... *H01L 21/78* (2013.01); *H01L 21/268* (2013.01)

(58) Field of Classification Search
CPC . H01L 21/78; H01L 21/268; H01L 21/76838; H01L 23/544; H01L 2221/68327; H01L 21/6835
(Continued)

(56) References Cited

U.S. PATENT DOCUMENTS 6,420,245 B1 * 7/2002 Manor .................. B28D 5/022
438/460
7,008,861 B2 * 3/2006 Andrews ................ B23K 26/53
257/E21.599
(Continued)

FOREIGN PATENT DOCUMENTS

CN 107214419 A 9/2017
JP 2009-188303 A 8/2009
(Continued)

OTHER PUBLICATIONS

International Search Report dated May 25, 2021 in International Patent Application No. PCT/JP2021/005957, with English translation.
(Continued)

*Primary Examiner* — Vu A Vu
(74) *Attorney, Agent, or Firm* — McDermott Will & Emery LLP

(57) ABSTRACT

A chip singulation method includes, in stated order: forming a surface supporting layer on an upper surface of a wafer; thinning the wafer from the undersurface to reduce the thickness to at most 30 μm; removing the surface supporting layer from the upper surface; forming a first metal layer and subsequently a second metal layer on the undersurface of the wafer; applying a dicing tape onto an undersurface of the second metal layer; applying, onto the upper surface of the wafer, a process of increasing hydrophilicity of a surface of the wafer; forming a water-soluble protective layer on the surface of the wafer; cutting the wafer, the first metal layer, and the second metal layer by irradiating a predetermined region of the upper surface of the wafer with a laser beam; and removing the water-soluble protective layer from the surface of the wafer using wash water.

8 Claims, 20 Drawing Sheets

Related U.S. Application Data

(60) Provisional application No. 62/980,033, filed on Feb. 21, 2020.

(58) Field of Classification Search
USPC ........................................................ 438/463
See application file for complete search history.

(56) References Cited

U.S. PATENT DOCUMENTS

| | | | |
|---|---|---|---|
| 7,129,114 B2* | 10/2006 | Akram | B23K 26/40 |
| | | | 438/110 |
| 7,550,367 B2* | 6/2009 | Tamura | H01L 21/6836 |
| | | | 438/464 |
| 8,642,385 B2* | 2/2014 | Xue | H01L 23/481 |
| | | | 257/737 |
| 9,312,178 B2 | 4/2016 | Van Der Stam et al. | |
| 10,784,161 B2* | 9/2020 | Muri | H01L 23/3114 |
| 11,211,250 B2* | 12/2021 | Sakamoto | H01L 21/78 |
| 2010/0120228 A1 | 5/2010 | Saito et al. | |
| 2011/0240616 A1 | 10/2011 | Osako et al. | |
| 2012/0329246 A1 | 12/2012 | Finn | |
| 2016/0218037 A1 | 7/2016 | Takano | |
| 2020/0365729 A1 | 11/2020 | Okawa et al. | |

FOREIGN PATENT DOCUMENTS

| | | |
|---|---|---|
| JP | 2010-114374 A | 5/2010 |
| JP | 2010-267638 A | 11/2010 |
| JP | 2013-524521 A | 6/2013 |
| JP | 2014-520407 A | 8/2014 |
| JP | 2016-139739 A | 8/2016 |
| JP | 2017-069243 A | 4/2017 |
| WO | 2020/129786 A1 | 6/2020 |

OTHER PUBLICATIONS

Japanese Office Action dated May 24, 2022 issued in the corresponding Japanese Patent Application No. 2022-032197.
Decision of Refusal dated Aug. 30, 2022, issued in the corresponding Japanese Patent Application No. 2022-032197.

* cited by examiner

<First process>

<Second process>

<Third process>

<Fourth process>

<Fifth process>

<Sixth process>

<Seventh process>

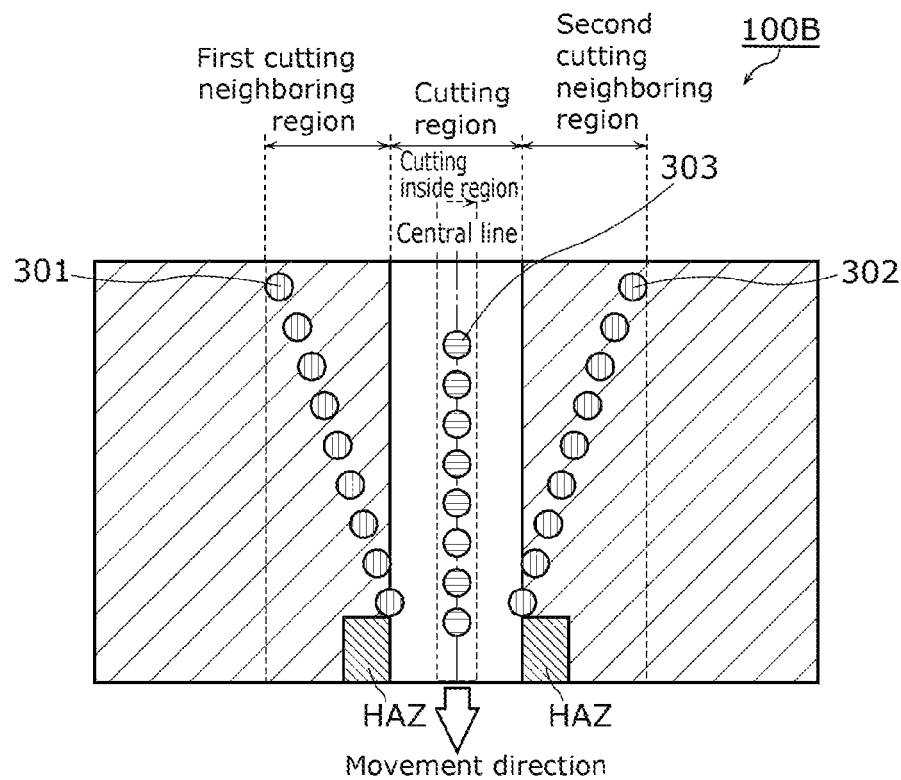
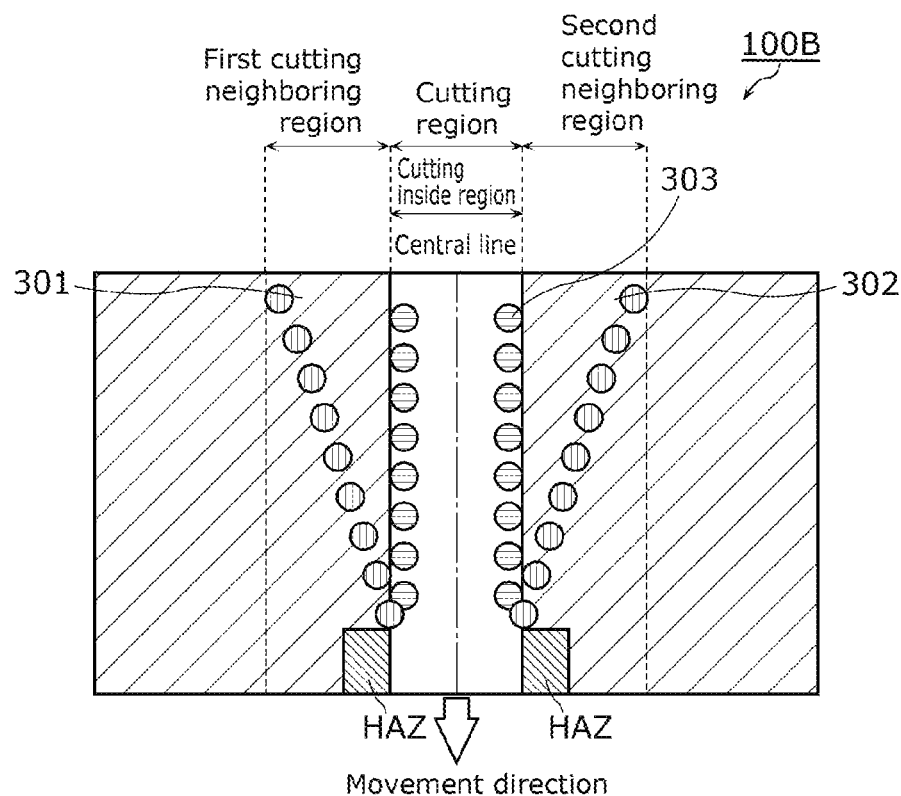

CHIP SINGULATION METHOD

CROSS REFERENCE TO RELATED APPLICATIONS

This is a continuation application of PCT International Application No. PCT/JP2021/005957 filed on Feb. 17, 2021, designating the United States of America, which is based on and claims priority of U.S. Provisional Patent Application No. 62/980,033 filed on Feb. 21, 2020. The entire disclosures of the above-identified applications, including the specifications, drawings and claims are incorporated herein by reference in their entirety.

FIELD

The present disclosure relates to a chip singulation method including dicing a wafer.

BACKGROUND

Conventionally, a semiconductor device that includes a semiconductor layer and a metal layer formed on an undersurface of the semiconductor layer has been known (for example, see Patent Literature (PTL) 1).

CITATION LIST

Patent Literature

PTL 1: WO 2020/129786

SUMMARY

Technical Problem

Such a semiconductor device that includes a semiconductor layer and a metal layer formed on the undersurface of the semiconductor layer is obtained by dicing a wafer that includes the metal layer formed on the undersurface thereof.

Conventionally, there has been a demand for a wafer having a relatively small thickness, or more specifically, a thickness of at most 30 μm, in order to reduce a resistance of the semiconductor layer in a thick direction in the semiconductor device as above.

However, if the thickness of the wafer that includes the metal layer formed on the undersurface thereof is at most 30 μm, it is difficult to dice the wafer using a blade.

In view of this, the present disclosure has been conceived in view of such a problem as stated above, and is to provide a chip singulation method including dicing a wafer without using a blade.

Solution to Problem

A chip singulation method according to an aspect of the present disclosure is a chip singulation method including dicing a wafer having an upper surface on which a plurality of semiconductor element structures are formed, the chip singulation method including, in stated order: a first process of forming a surface supporting layer on the upper surface of the wafer; a second process of thinning the wafer from an undersurface thereof to reduce a thickness of the wafer to at most 30 μm; a third process of removing the surface supporting layer from the upper surface of the wafer; a fourth process of forming, in stated order, a first metal layer and a second metal layer on the undersurface of the wafer that has been thinned; a fifth process of applying a dicing tape onto an undersurface of the second metal layer; a sixth process of applying, onto the upper surface of the wafer, a process of increasing hydrophilicity of a surface of the wafer; a seventh process of forming a water-soluble protective layer on the surface of the wafer; an eighth process of cutting the wafer, the first metal layer, and the second metal layer by irradiating a predetermined region of the upper surface of the wafer with a laser beam; and a ninth process of removing the water-soluble protective layer from the surface of the wafer using wash water. The first metal layer has a thickness ranging from at least 30 μm to at most 60 μm, the second metal layer has a thickness ranging from at least 10 μm to at most 40 μm, the first metal layer has a Young's modulus ranging from at least 80 GPa to at most 130 GPa, and the second metal layer has a Young's modulus ranging from at least 190 GPa to at most 220 GPa.

A chip singulation method according to an aspect of the present disclosure is a chip singulation method including dicing a wafer having an upper surface on which a plurality of semiconductor element structures are formed, the chip singulation method including, in stated order: a first process of thinning the wafer from an undersurface thereof; a second process of forming a metal layer on the undersurface of the wafer that has been thinned; a third process of cutting the wafer and the metal layer by irradiating a predetermined region of the upper surface of the wafer with a first laser beam; and a fourth process of irradiating cutting neighboring regions with a second laser beam and irradiating a cutting inside region with a third laser beam, the cutting neighboring regions lying, in a plan view of the wafer, in predetermined areas on sides of a central line of a cutting region in which the wafer and the metal layer are cut in the third process, the cutting inside region being included in the cutting region in the plan view of the wafer.

Advantageous Effects

According to the chip singulation methods according to the aspects of the present disclosure, a wafer can be diced without using a blade.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 12A is a schematic enlarged plan view illustrating an example of a state in which the upper surface of the wafer is irradiated with a second laser beam and a third laser beam in the forty-ninth process according to Embodiment 3.

FIG. 12B is a schematic enlarged plan view illustrating an example of a state in which the upper surface of the wafer is irradiated with a second laser beam and a third laser beam in the forty-ninth process according to Embodiment 3.

DESCRIPTION OF EMBODIMENTS

Figure 1:
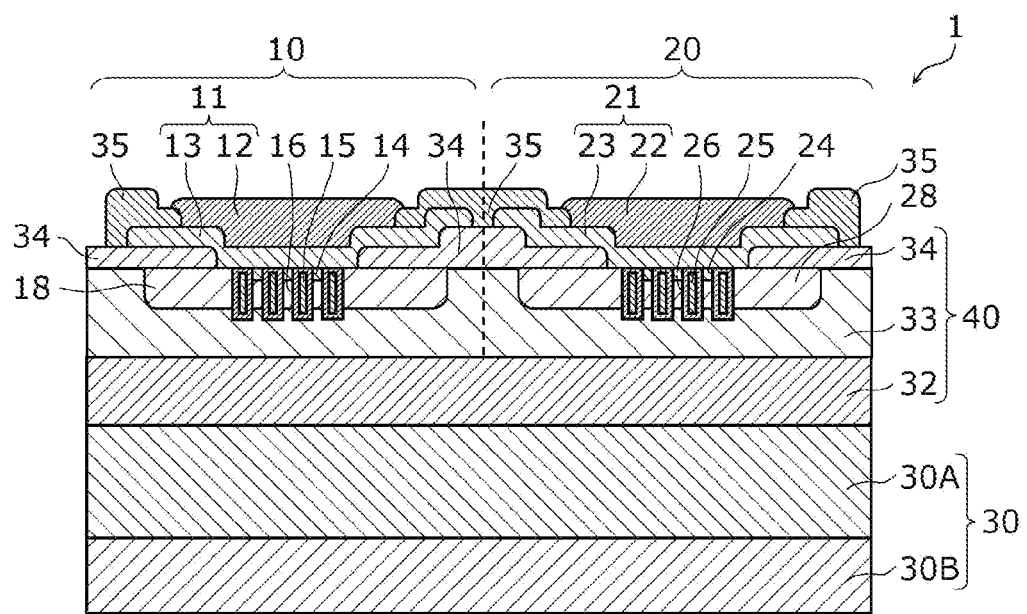
FIG. 1 is a cross-sectional view illustrating an example of a structure of a semiconductor device according to Embodiment 1.

[Circumstances that have LED to Aspects of the Present Disclosure]

The inventors have repeatedly and diligently conducted experiments and examinations on a chip singulation method including dicing a wafer having an undersurface on which a metal layer is formed, without using a blade. The inventors have found that the wafer having an undersurface on which the metal layer is formed can be cut together with the metal layer by irradiating the upper surface of the wafer with a laser beam.

The inventors have further repeatedly and diligently conducted experiments and examinations based on such findings. More specifically, the inventors have repeatedly and diligently conducted experiments and examinations, using a wafer having a thickness of at most 30 μm and an undersurface on which a first metal layer and a second metal layer are formed, where the first metal layer has a thickness ranging from at least 30 μm to at most 60 μm, and is made of a metal having a Young's modulus ranging from at least 80 GPa to at most 130 GPa (such as silver or copper, for example), and the second metal layer has a thickness ranging from at least 10 μm to at most 40 μm, and is made of a metal having a Young's modulus ranging from 190 GPa to at most 220 GPa (such as nickel, for example).

The following describes details of the experiments and examinations conducted by the inventors.

When a metal layer is cut using a laser, a formation resulting from metal scattered due to irradiation with a laser beam and/or a formation produced by metal once liquefied or vaporized due to heat from irradiation with a laser beam being cooled and solidified again adhere(s) to the semiconductor device, which is a known phenomenon. Accordingly, when a metal layer is cut using a laser, desirably, the surface of a wafer is covered with a water-soluble protective layer before being irradiated with a laser beam so as to avoid adhesion of a formation that contains metal included in the metal layer onto the surface of the wafer. In this case, if the entire surface of the wafer is not covered with such a water-soluble protective layer, a formation that contains metal included in the metal layer may adhere to a portion of the surface of the wafer that is not covered with the water-soluble protective layer.

In general, a process of thinning a wafer is performed by grinding the undersurface of the wafer before a process of forming a metal layer on the undersurface of the wafer. In order to protect the upper surface of the wafer in the thinning process, a process of forming a surface supporting layer on the upper surface of the wafer is performed before the thinning process. The surface supporting layer is removed from the wafer after the thinning process.

Through the experiments and examinations, the inventors have found the cause of adhesion of a formation that contains metal included in a metal layer onto a semiconductor layer lies in a phenomenon that when the surface supporting layer is removed from the upper surface of the wafer, the surface supporting layer locally or partially remains on the surface of the wafer, and the remaining surface supporting layer decreases the hydrophilicity of the surface of the wafer, which prevents the entire surface of the wafer from being covered with a water-soluble protective layer. The inventors further conducted experiments and examinations based on such findings, assuming that if the surface of a wafer is made highly hydrophilic at the start of the process of covering the entire surface of the wafer with a water-soluble protective layer, a semiconductor device in which adhesion of a formation that contains metal included in a metal layer is reduced can be separated. As a result, the inventors have conceived a chip singulation method as will be described below.

A chip singulation method according to an aspect of the present disclosure is a chip singulation method including dicing a wafer having an upper surface on which a plurality of semiconductor element structures are formed, the chip singulation method including, in stated order: a first process of forming a surface supporting layer on the upper surface of the wafer; a second process of thinning the wafer from an undersurface thereof to reduce a thickness of the wafer to at most 30 µm; a third process of removing the surface supporting layer from the upper surface of the wafer; a fourth process of forming, in stated order, a first metal layer and a second metal layer on the undersurface of the wafer that has been thinned; a fifth process of applying a dicing tape onto an undersurface of the second metal layer; a sixth process of applying, onto the upper surface of the wafer, a process of increasing hydrophilicity of a surface of the wafer; a seventh process of forming a water-soluble protective layer on the surface of the wafer; an eighth process of cutting the wafer, the first metal layer, and the second metal layer by irradiating a predetermined region of the upper surface of the wafer with a laser beam; and a ninth process of removing the water-soluble protective layer from the surface of the wafer using wash water. The first metal layer has a thickness ranging from at least 30 µm to at most 60 µm, the second metal layer has a thickness ranging from at least 10 µm to at most 40 µm, the first metal layer has a Young's modulus ranging from at least 80 GPa to at most 130 GPa, and the second metal layer has a Young's modulus ranging from at least 190 GPa to at most 220 GPa.

According to the chip singulation method, the wafer can be diced without using a blade.

According to the chip singulation method, the surface of the wafer can be made highly hydrophilic in the sixth process, before the water-soluble protective layer is formed on the surface of the wafer in the seventh process. Accordingly, the entire surface of the wafer can be covered with the water-soluble protective layer in the seventh process. Thus, this reduces adhesion, on the surface of the wafer, of a formation that contains metal included in the metal layer and is formed due to irradiation with a laser beam in the eighth process. Consequently, in the semiconductor device separated by the chip singulation method, adhesion of a formation that contains metal included in the metal layer is reduced.

Thus, the chip singulation method provides such a semiconductor device in which adhesion of a formation that contains metal included in the metal layer is reduced.

The predetermined region may include a plurality of streets forming a lattice that divides the wafer into the plurality of semiconductor element structures in a plan view of the wafer. The eighth process may include: an eleventh process of performing a tenth process a plurality of times on each of a plurality of first streets that extend in a first direction in the plan view of the wafer, the tenth process performed each of the plurality of times being a process of emitting the laser beam onto the first street from one end to another end of the first street or from the other end to the one end of the first street, the plurality of first streets being included in the plurality of streets forming the lattice; and a thirteenth process of performing a twelfth process a plurality of times on each of a plurality of second streets that extend in a second direction orthogonal to the first direction in the plan view of the wafer, the twelfth process performed each of the plurality of times being a process of emitting the laser beam onto the second street from one end to another end of the second street or from the other end to the one end of the second street, the plurality of second streets being included in the plurality of streets forming the lattice. The eleventh process may be a process in which in a period from a start to an end of performing the tenth process the plurality of times on one of the plurality of first streets, the laser beam is prevented from being emitted onto a remaining one or more of the plurality of first streets, and the thirteenth process may be a process in which in a period from a start to an end of performing the twelfth process the plurality of times on one of the plurality of second streets, the laser beam is prevented from being emitted onto a remaining one or more of the plurality of second streets.

The first metal layer and the second metal layer have a bimetal structure made of two types of metals having different Young's moduli. Thus, if in a state in which the wafer, the first metal layer, and the second metal layer in one street are not completely cut, cutting of the wafer, the first metal layer, and the second metal layer in the next street is started, the warping stress in the wafer is ununiformly released in the wafer, which may cause displacement of the streets.

According to the above chip singulation method, in the eleventh process, the tenth process is performed on one of the first streets a plurality of times, and thereafter starts being performed on the next one of the first streets. Accordingly, the wafer, the first metal layer, and the second metal layer in one of the first streets are certainly completely cut, and thereafter cutting of the wafer, the first metal layer, and the second metal layer in the next one of the first streets can be started.

Similarly, in the thirteenth process, the twelfth process is performed on one of the second streets a plurality of times, and thereafter starts being performed on the next one of the second streets. Accordingly, the wafer, the first metal layer, and the second metal layer in one of the second streets are certainly completely cut, and thereafter cutting of the wafer, the first metal layer, and the second metal layer in the next one of the second streets can be started.

As described above, according to the chip singulation method, in a state in which the wafer, the first metal layer, and the second metal layer in one of the streets are not completely cut, cutting of the wafer, the first metal layer, and the second metal layer in the next one of the streets can be prevented from being started.

Accordingly, the chip singulation method can reduce the occurrence of displacement of the streets, which is caused by the release of the warping stress of the wafer, during the irradiation with a laser beam.

In the eleventh process, the tenth process may be performed the plurality of times on each of the plurality of first streets in an arrangement direction from a first street at an end in the second direction to a first street at another end in the second direction, and in the thirteenth process, the twelfth process may be performed the plurality of times on each of the plurality of second streets in an arrangement direction from a second street at an end in the first direction to a second street at another end in the first direction.

Accordingly, the wafer, the first metal layer, and the second metal layer in the first streets can be efficiently cut, and the wafer, the first metal layer, and the second metal layer in the second streets can be efficiently cut.

In the eleventh process, the tenth process performed the plurality of times on each of the plurality of first streets may consist of: a first forward irradiation process of emitting the laser beam onto the first street from the one end to the other end of the first street, the first forward irradiation process being performed once; and a first backward irradiation process of emitting the laser beam onto the first street from the other end to the one end of the first street, the first backward irradiation process being performed once, and in the thirteenth process, the twelfth process performed the plurality of times on each of the plurality of second streets may consist of: a second forward irradiation process of emitting the laser beam onto the second street from the one end to the other end of the second street, the second forward irradiation process being performed once; and a second backward irradiation process of emitting the laser beam onto the second street from the other end to the one end of the second street, the second backward irradiation process being performed once.

Accordingly, when the wafer, the first metal layer, and the second metal layer in one street are cut by performing the tenth process twice, the tenth process can be efficiently performed twice as stated above.

The first metal layer may be cut in a preceding one of the first forward irradiation process and the first backward irradiation process, and the first metal layer may be cut in a preceding one of the second forward irradiation process and the second backward irradiation process.

In the eleventh process, the tenth process performed the plurality of times on each of the plurality of first streets may consist of: a first forward irradiation process of emitting the laser beam onto the first street from the one end to the other end of the first street, the first forward irradiation process being performed one or more times; and a first backward irradiation process of emitting the laser beam onto the first street from the other end to the one end of the first street, the first backward irradiation process being performed one or more times. A condition under which the laser beam is emitted in the first forward irradiation process and a condition under which the laser beam is emitted in the first backward irradiation process may be same. In the thirteenth process, the twelfth process performed the plurality of times on each of the plurality of second streets may consist of: a second forward irradiation process of emitting the laser beam onto the second street from the one end to the other end of the second street, the second forward irradiation process being performed one or more times; and a second backward irradiation process of emitting the laser beam onto the second street from the other end to the one end of the second street, the second backward irradiation process being performed one or more times. A condition under which the laser beam is emitted in the second forward irradiation process and a condition under which the laser beam is emitted in the second backward irradiation process may be same.

Accordingly, it is unnecessary to change the condition for irradiation with a laser beam in the eleventh process, and it is unnecessary to change the condition for irradiation with a laser beam in the thirteenth process.

The chip singulation method may further include: a fourteenth process of forming a groove in an inter-element-structure region between adjacent ones of the plurality of semiconductor element structures, in a period from when the seventh process ends until when the eighth process starts, the inter-element-structure region being a region of the upper surface of the wafer. The predetermined region may be included in the inter-element-structure region.

In general, if a wafer is irradiated with a laser beam having output power for cutting a metal layer, a region referred to as a heat affected zone (HAZ) resulting from properties of semiconductor crystals being altered by the influence of heat from the laser beam is often formed in the vicinity of the cutting region of the wafer.

According to the above chip singulation method, a region in which a HAZ, which is formed due to being irradiated with a laser beam in the eighth process, may be generated can be removed in advance in the fourteenth process.

Accordingly, the above chip singulation method provides a semiconductor device in which formation of a HAZ is reduced.

A chip singulation method according to an aspect of the present disclosure is a chip singulation method including dicing a wafer having an upper surface on which a plurality of semiconductor element structures are formed, the chip singulation method including, in stated order: a first process of thinning the wafer from an undersurface thereof; a second process of forming a metal layer on the undersurface of the wafer that has been thinned; a third process of cutting the wafer and the metal layer by irradiating a predetermined region of the upper surface of the wafer with a first laser beam; and a fourth process of irradiating cutting neighboring regions with a second laser beam and irradiating a cutting inside region with a third laser beam, the cutting neighboring regions lying, in a plan view of the wafer, in predetermined areas on sides of a central line of a cutting region in which the wafer and the metal layer are cut in the third process, the cutting inside region being included in the cutting region in the plan view of the wafer.

According to the above chip singulation method, the wafer can be diced without using a blade.

According to the above chip singulation method, a HAZ that may be formed by the first laser beam emitted in the third process can be removed by the irradiation with the second laser beam in the fourth process.

On the other hand, a formation that contains metal included in the metal layer often adheres as a burr to the inside of the cutting region in the plan view of the wafer, due to irradiation with the second laser beam in the fourth process.

To address this, according to the above chip singulation method, such a burr can be removed by the irradiation with the third laser beam in the fourth process.

Thus, the above chip singulation method provides a semiconductor device in which formation of a HAZ and adhesion of such a burr are reduced.

The first laser beam, the second laser beam, and the third laser beam may be output from a single laser beam output device.

Accordingly, the above chip singulation method can be performed using a single laser beam output device.

In the plan view of the wafer, the cutting neighboring regions may include: a first cutting neighboring region on one of the sides of the central line; and a second cutting neighboring region on another of the sides of the central line. In the fourth process, when the cutting neighboring regions are irradiated with the second laser beam, the first cutting neighboring region may be irradiated with a plurality of first irradiation spotlights, and the second cutting neighboring region may be irradiated with a plurality of second irradiation spotlights, the plurality of first irradiation spotlights resulting from a portion of a laser beam output by the single laser beam output device being split, the plurality of second irradiation spotlights resulting from a portion of a laser beam output by the single laser beam output device being split, when the cutting inside region is irradiated with the third laser beam, the cutting inside region may be irradiated with a plurality of third irradiation spotlights resulting from a portion of a laser beam output by the single laser beam output device being split, in the plan view of the wafer, the plurality of first irradiation spotlights, the plurality of second irradiation spotlights, and the plurality of third irradiation spotlights may be moved or the wafer may be moved to extend, relative to the wafer, portions irradiated with the plurality of first irradiation spotlights, the plurality of second irradiation spotlights, and the plurality of third irradiation spotlights in a cutting direction of the cutting region, in the plan view of the wafer, the plurality of first irradiation spotlights and the plurality of second irradiation spotlights may be axisymmetric in respect to the central line serving as a symmetric axis, in the plan view of the wafer, the plurality of first irradiation spotlights may be in positions in which a shortest distance between the plurality of first irradiation spotlights and the central line is monotonically non-decreasing from front to rear in a movement direction in which the portions irradiated with the plurality of first irradiation spotlights, the plurality of second irradiation spotlights, and the plurality of third irradiation spotlights extend relative to the wafer, and in the plan view of the wafer, the plurality of third irradiation spotlights may be aligned in one or more straight lines.

In general, the area of a HAZ in which its properties are altered is greater as closer to the surface of a wafer that is irradiated with a laser beam. Thus, a portion that extends farther from the cutting region needs to be removed in a shallow location relative to the surface of the wafer. In contrast, the area of the HAZ in which its properties are altered is smaller as farther from the surface of the wafer, and thus only a portion close to the cutting region needs to be removed in a deep location relative to the surface of the wafer. By emitting a laser beam in the above manner, even if the intensity of a laser beam is the same on all the irradiation spots, the irradiation spots overlap so that a portion having a shallow depth from the surface of the wafer irradiated with a laser beam is removed from an area up to a point farther from the cutting region, whereas a portion having a great depth from the surface of the wafer is removed from only an area close to the cutting region. This is because the laser beam emitted on each irradiation spot has intensities normally distributed about the irradiation spot. Furthermore, by shifting the positions of the irradiation spots slightly from one another, a probability that one or more of the irradiation spots are positioned near the edges of the cutting region, so that a desired process can be performed.

In the plan view of the wafer, at least one of the plurality of first irradiation spotlights may be positioned in the cutting region.

Accordingly, even if a HAZ is formed in the cutting region, the HAZ formed in the cutting region can be removed through the irradiation with the second laser beam in the fourth process.

In the plan view of the wafer, the plurality of first irradiation spotlights may be aligned in one straight line.

Accordingly, the second laser beam can be prevented from being emitted on the same spot a plurality of times.

In the plan view of the wafer, the plurality of first irradiation spotlights may be aligned along two or more sides.

Accordingly, the cutting neighboring regions can be prevented from being unnecessarily extended.

In the plan view of the wafer, at least one of the plurality of third irradiation spotlights may be positioned ahead of the plurality of first irradiation spotlights in the movement direction.

Accordingly, irradiation with the third laser beam prior to the irradiation with the second laser beam can increase in advance the temperature of a region that is to be processed with the second laser beam, and thus the metal layer can be efficiently vaporized. Thus, the adhesion of such a burr can be reduced.

In the plan view of the wafer, at least one of the plurality of first irradiation spotlights may be positioned ahead of the plurality of third irradiation spotlights in the movement direction.

Accordingly, a formation that contains metal included in the metal layer and is newly generated by the irradiation with the second laser beam can be removed by the third laser beam after such a formation becomes a burr that can be readily removed. Thus, the adhesion of such a burr can be reduced.

In the plan view of the wafer, at least one of the plurality of third irradiation spotlights may be positioned rear of the plurality of first irradiation spotlights in the movement direction.

Accordingly, a formation that contains metal included in the metal layer and is newly generated by the irradiation with the second laser beam can be more effectively removed by the third laser beam. Thus, the adhesion of such a burr can be reduced.

In the plan view of the wafer, the plurality of third irradiation spotlights may be aligned in two straight lines.

Accordingly, such a burr can be more effectively removed.

The following describes specific examples of a chip singulation method according to aspects of the present disclosure with reference to the drawings. Embodiments described herein are specific examples of the present disclosure. The numerical values, shapes, elements, the arrangement and connection of the elements, steps (processes), and the processing order of the steps, for instance, described in the following embodiments are mere examples, and thus are not intended to limit the present disclosure. The drawings are schematic diagrams and do not necessarily provide strict illustration. Throughout the drawings, the same numeral is given to substantially the same element, and redundant description is omitted or simplified.

Embodiment 1

[1-1. Structure of Semiconductor Device]

The following describes a structure of a semiconductor device according to Embodiment 1. The semiconductor device according to Embodiment 1 is a chip-size-package-type (CSP) semiconductor device that is facedown mountable, and in which two vertical metal oxide semiconductor (MOS) transistors are formed. The two vertical MOS transistors are power transistors, and are so-called trench metal oxide semiconductor field effect transistors (MOSFETs).

Figure 2:
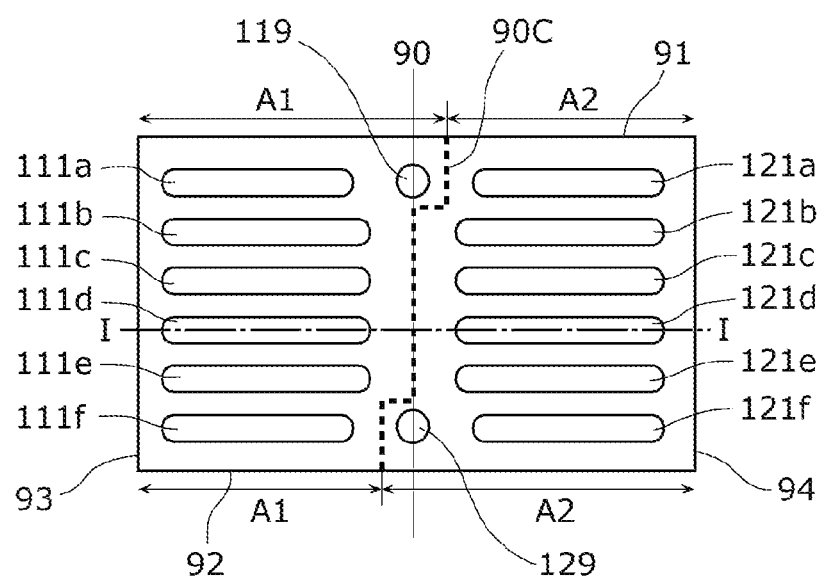
FIG. 2 is a plan view illustrating an example of a structure of the semiconductor device according to Embodiment 1.

FIG. 1 is a cross-sectional view illustrating an example of a structure of semiconductor device 1 according to Embodiment 1. FIG. 2 is a plan view illustrating an example of a configuration of semiconductor device 1. FIG. 1 illustrates a cross section taken along I-I in FIG. 2.

As illustrated in FIG. 1 and FIG. 2, semiconductor device 1 includes semiconductor layer 40, metal layer 30, first vertical MOS transistor 10 (hereinafter, also referred to as "transistor 10") formed in first region A1 of semiconductor layer 40, and second vertical MOS transistor 20 (hereinafter, also referred to as "transistor 20") formed in second region A2 of semiconductor layer 40. Here, as illustrated in FIG. 2, first region A1 and second region A2 are adjacent to each other in a plan view of semiconductor layer 40, and are one and the other of the regions that are equal halves of the surface area of semiconductor device 1.

Semiconductor layer 40 has a configuration in which semiconductor substrate 32, low-concentration impurity layer 33, and oxide film 34 are stacked. Note that in the present application, when a description is given on the thickness of a wafer, or more specifically, when a description is given on a case in which, for example, a process of thinning a wafer is performed to reduce the thickness thereof to at most 30 µm, the wafer refers to semiconductor layer 40.

Semiconductor substrate 32 is disposed at a bottom portion of semiconductor layer 40, and includes silicon that contains an impurity of a first conductivity type.

Low-concentration impurity layer 33 is disposed in an upper portion of semiconductor layer 40, is formed in contact with semiconductor substrate 32, and contains an impurity of the first conductivity type having a lower concentration than the concentration of the impurity of the first conductivity type of semiconductor substrate 32. Low-concentration impurity layer 33 may be formed on semiconductor substrate 32 by epitaxial growth, for example.

Oxide film 34 is disposed at an uppermost portion of semiconductor layer 40, being formed in contact with low-concentration impurity layer 33.

Protective layer 35 is formed in contact with the upper surface of semiconductor layer 40, and covers at least a portion of the upper surface of semiconductor layer 40.

Metal layer 30 is formed in contact with the entire undersurface of semiconductor substrate 32. Metal layer 30 has a configuration in which first metal layer 30A on the semiconductor substrate 32 side and second metal layer 30B on the opposite side are stacked.

First metal layer 30A is formed by plating, for example, and has a thickness ranging from at least 30 µm to at most 60 µm, and a Young's modulus ranging from at least 80 GPa to at most 130 GPa. First metal layer 30A may include silver or copper as a non-limiting example.

Second metal layer 30B is formed by plating, for example, and has a thickness ranging from at least 10 µm to at most 40 µm, and a Young's modulus ranging from at least 190 GPa and at most 220 GPa. Second metal layer 30B may include nickel as a non-limiting example.

Note that first metal layer 30A and second metal layer 30B may each contain a trace element that mixes as an impurity, other than metal, in a manufacturing process of a metal material.

As illustrated in FIG. 1 and FIG. 2, transistor 10 includes, on the upper surface of semiconductor layer 40, one or more (here, six) first source pads 111 (here, first source pads 111a, 111b, 111c, 111d, 111e, and 111f) and first gate pad 119, which are bonded to a mounting substrate via a bonding material, when semiconductor device 1 is mounted facedown. Further, transistor 20 includes, on the upper surface of semiconductor layer 40, one or more (here, six) second source pads 121 (here, second source pads 121a, 121b, 121c, 121d, 121e, and 121f) and second gate pad 129, which are bonded to a mounting substrate via a bonding material, when semiconductor device 1 is mounted facedown.

As illustrated in FIG. 1 and FIG. 2, semiconductor layer 40 is quadrilateral, and transistor 10 and transistor 20 are arranged in a first direction in a plan view. Here, semiconductor layer 40 has a rectangular shape having one long side 91 and another long side 92 parallel to the first direction, and one short side 93 and another short side 94 perpendicular to the first direction. Thus, semiconductor layer 40 has a rectangular shape having the long sides extending in the first direction, herein.

In FIG. 2, center line 90 bisects rectangular semiconductor layer 40 in the first direction, in the plan view of semiconductor layer 40. Accordingly, center line 90 is a straight line extending in a direction perpendicular to the first direction in the plan view of semiconductor layer 40.

Boundary 90C is between first region A1 and second region A2. In the plan view of semiconductor layer 40, boundary 90C bisects the surface area of semiconductor layer 40, but is not necessarily a straight line. In the plan view of semiconductor layer 40, center line 90 may or may not coincide with boundary 90C.

Note that the number of first gate pads 119 and the number of second gate pads 129 are not each necessarily limited to one as illustrated in FIG. 2.

Note that the number of one or more first source pads 111 and the number of one or more second source pads 121 are not each necessarily limited to six as illustrated in FIG. 2, and may each be at least one except six.

As illustrated in FIG. 1 and FIG. 2, first body region 18 that contains an impurity of a second conductivity type different from the first conductivity type is formed in first region A1 of low-concentration impurity layer 33. In first body region 18, first source region 14 that contains an impurity of the first conductivity type, first gate conductor 15, and first gate insulating film 16 are formed. First source electrode 11 includes portion 12 and portion 13, and portion 12 is connected to first source region 14 and first body region 18 via portion 13. First gate conductor 15 is electrically connected to first gate pad 119.

Portion 12 of first source electrode 11 is a layer bonded by reflow soldering when semiconductor device 1 is mounted facedown, and may include a metal material that contains at least one of nickel, titanium, tungsten, or palladium, as a non-limiting example. The upper surface of portion 12 may be plated with gold, for instance.

Portion 13 of first source electrode 11 is a layer that connects portion 12 to semiconductor layer 40, and may include a metal material that contains at least one of aluminum, copper, gold, or silver, as a non-limiting example.

Second body region 28 that contains an impurity of the second conductivity type is formed in second region A2 of low-concentration impurity layer 33. In second body region 28, second source region 24 that contains an impurity of the first conductivity type, second gate conductor 25, and second gate insulating film 26 are formed. Second source electrode 21 includes portion 22 and portion 23, and portion 22 is connected to second source region 24 and second body region 28 via portion 23. Second gate conductor 25 is electrically connected to second gate pad 129.

Portion 22 of second source electrode 21 is a layer bonded by reflow soldering when semiconductor device 1 is mounted facedown, and may include a metal material that contains at least one of nickel, titanium, tungsten, or palladium, as a non-limiting example. The upper surface of portion 22 may be plated with gold, for instance.

Portion 23 of second source electrode 21 is a layer that connects portion 22 to semiconductor layer 40, and may include a metal material that contains at least one of aluminum, copper, gold, or silver, as a non-limiting example.

The above configuration of transistor 10 and transistor 20 allows low-concentration impurity layer 33 and semiconductor substrate 32 to function as a common drain region that is used as both a first drain region of transistor 10 and a second drain region of transistor 20.

As illustrated in FIG. 1, first body region 18 is covered with oxide film 34 having an opening, and portion 13 of first source electrode 11, which is connected to first source region 14 via the opening of oxide film 34, is provided. Oxide film 34 and portion 13 of first source electrode 11 are covered with protective layer 35 having an opening, and portion 12 connected to portion 13 of first source electrode 11 via the opening of protective layer 35 is provided.

Second body region 28 is covered with oxide film 34 having an opening, and portion 23 of second source electrode 21, which is connected to second source region 24 via the opening of oxide film 34, is provided. Oxide film 34 and portion 23 of second source electrode 21 are covered with protective layer 35 having an opening, and portion 22 connected to portion 23 of second source electrode 21 via the opening of protective layer 35 is provided.

Thus, one or more first source pads 111 and one or more second source pads 121 indicate regions of first source electrode 11 and second source electrode 21, respectively, which are partially exposed from the upper surface of semiconductor device 1, that is, so-called terminal portions. Similarly, first gate pad 119 and second gate pad 129 indicate regions of first gate electrode 19 (not illustrated in FIG. 1 or FIG. 2) and second gate electrode 29 (not illustrated in FIG. 1 or FIG. 2), respectively, which are partially exposed from the upper surface of semiconductor device 1, that is, so-called terminal portions. In the Specification, "electrode pad" is a generic term for source pads and gate pads.

Further, the thickness of semiconductor layer 40 ranges from 10 μm to 90 μm, the thickness of metal layer 30 ranges from 40 μm to 100 μm, and a sum of the thicknesses of oxide film 34 and protective layer 35 ranges from 3 μm to 13 μm, as examples of typical designs for structures in semiconductor device 1.

[1-2. Chip Singulation Method for Separating Semiconductor Device]

Semiconductor device 1 is obtained by dicing a wafer on which a plurality of semiconductor element structures are formed.

Here, chip singulation (separating from a wafer) means cutting a wafer and separating a plurality of semiconductor element structures formed on the wafer in an array into individual structures.

The following describes a first chip singulation method for separating semiconductor device 1 from a wafer.

The first chip singulation method is performed on a wafer on which a plurality of semiconductor element structures are formed in an array. The first chip singulation method includes a plurality of processes.

Figure 3A:
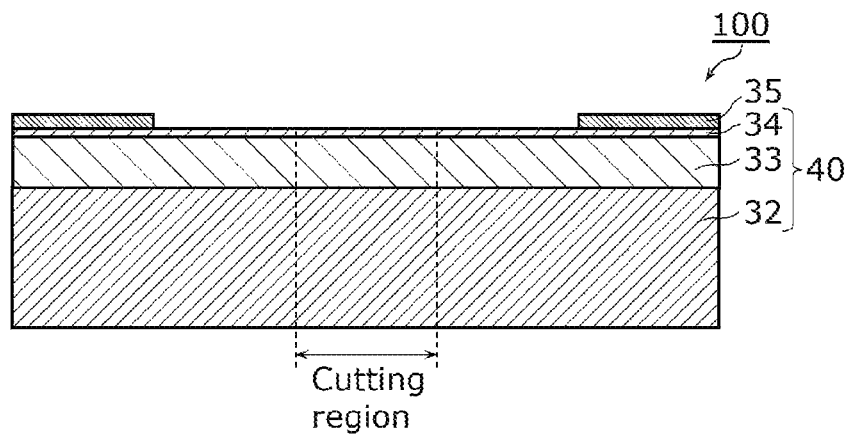
FIG. 3A is a schematic enlarged cross-sectional view of a wafer according to Embodiment 1.

FIG. 3A is a schematic enlarged cross-sectional view of a cutting region and therearound of wafer 100 when the first chip singulation method is to be started, and FIG. 3B to FIG. 3J are schematic enlarged cross-sectional views of the cutting region and therearound of wafer 100 in the processes performed in the first chip singulation method.

As illustrated in FIG. 3B to FIG. 3J, the first chip singulation method includes a first process to a ninth process in the order.

Figure 3B:
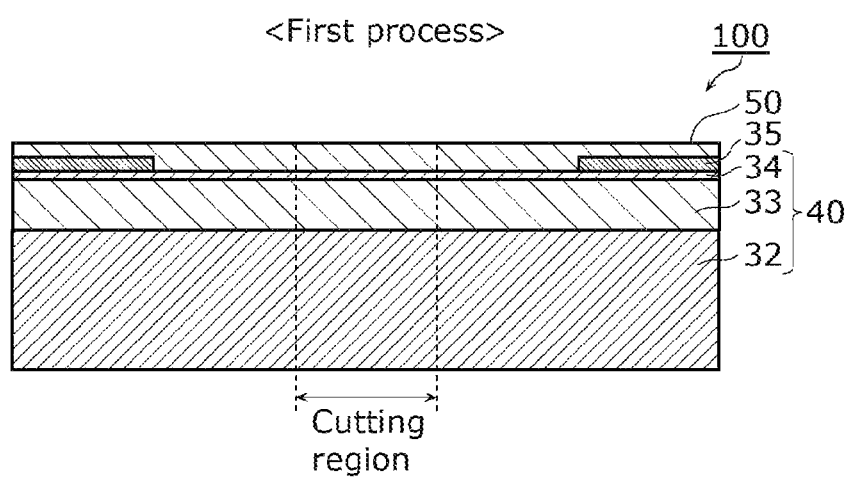
FIG. 3B is a schematic enlarged cross-sectional view of the wafer according to Embodiment 1.

As illustrated in FIG. 3B, the first process is a process of forming surface supporting layer 50 on the upper surface of wafer 100. The first process is performed to prevent the surface of wafer 100 from being damaged or becoming unclean, for instance, due to a foreign substance that may be generated in a second process described later.

Surface supporting layer 50 may be a backgrinding tape, for example. If surface supporting layer 50 is a backgrinding tape, the first process is performed by applying the backgrinding tape onto the upper surface of wafer 100, for example. The backgrinding tape may be, for example, an adhesive tape that includes an ethylene-vinyl acetate copolymer as a surface base material, and an acrylic resin as an adhesive layer.

Figure 3C:
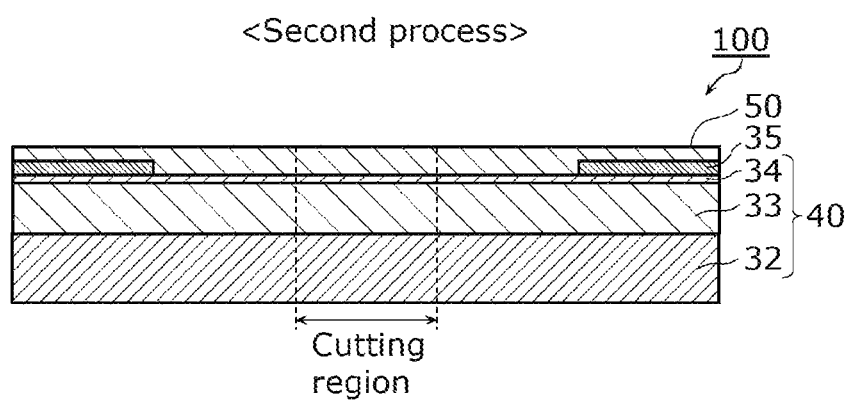
FIG. 3C is a schematic enlarged cross-sectional view of the wafer according to Embodiment 1.

As illustrated in FIG. 3C, the second process is a process of thinning wafer 100 from the undersurface thereof to reduce the thickness thereof to at most 30 μm.

The second process is performed by grinding the undersurface of wafer 100, for example. In general, a process of grinding the undersurface of a wafer is also referred to as backgrinding. Thus, stated differently, the second process is performed by backgrinding on the undersurface of wafer 100, for example. Note that the final stage of the second process may include a transition from grinding to polishing or etching.

Figure 3D:
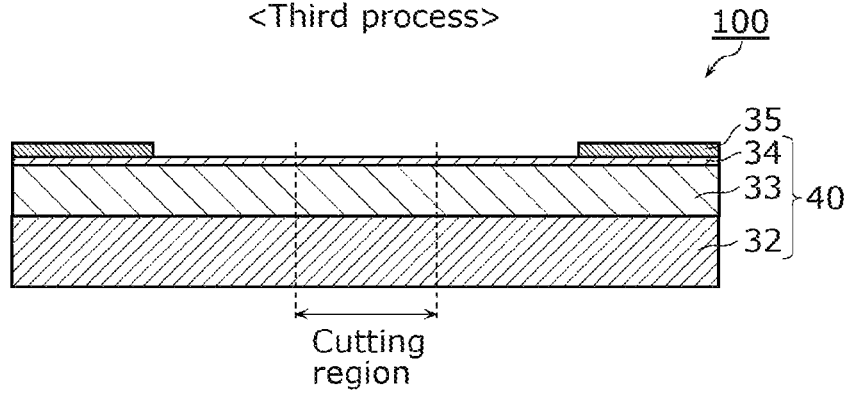
FIG. 3D is a schematic enlarged cross-sectional view of the wafer according to Embodiment 1.

As illustrated in FIG. 3D, a third process is a process of removing, from the upper surface of wafer 100, surface supporting layer 50 formed on the upper surface of wafer 100 in the first process.

If surface supporting layer 50 is a backgrinding tape, the third process is performed by removing the applied backgrinding tape from the upper surface of wafer 100, for example.

It is difficult to completely remove surface supporting layer 50 formed on the upper surface of wafer 100 in the third process.

Figure 3E:
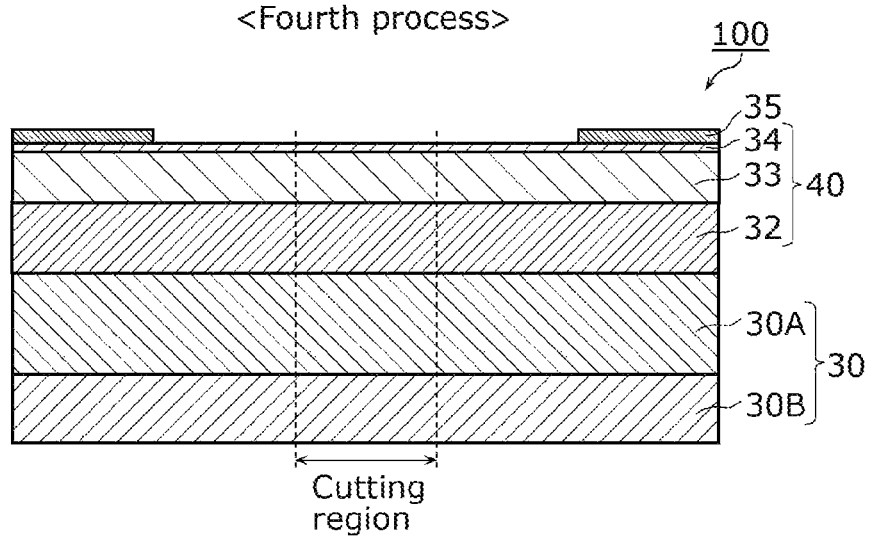
FIG. 3E is a schematic enlarged cross-sectional view of the wafer according to Embodiment 1.

As illustrated in FIG. 3E, a fourth process is a process of forming first metal layer 30A and second metal layer 30B in this order, namely metal layer 30 on the undersurface of wafer 100 that has been thinned in the second process.

First metal layer 30A and second metal layer 30B may each include a single metal or may include an alloy of a plurality of metals, for example. Furthermore, first metal layer 30A and second metal layer 30B may each include a single layer including a single metal or an alloy, or a stack of a plurality of layers each including a different metal or alloy.

First metal layer 30A may be formed, for example, by depositing metal onto the undersurface of wafer 100, by plating the undersurface of wafer 100 with metal, or by depositing metal onto the undersurface of wafer 100 and thereafter plating the undersurface of wafer 100 with the same or different metal.

Second metal layer 30B may be formed, for example, by depositing metal onto the undersurface of first metal layer 30A, by plating the undersurface of first metal layer 30A with metal, or by depositing metal onto the undersurface of first metal layer 30A and thereafter plating the undersurface of first metal layer 30A with the same or different metal.

Figure 3F:
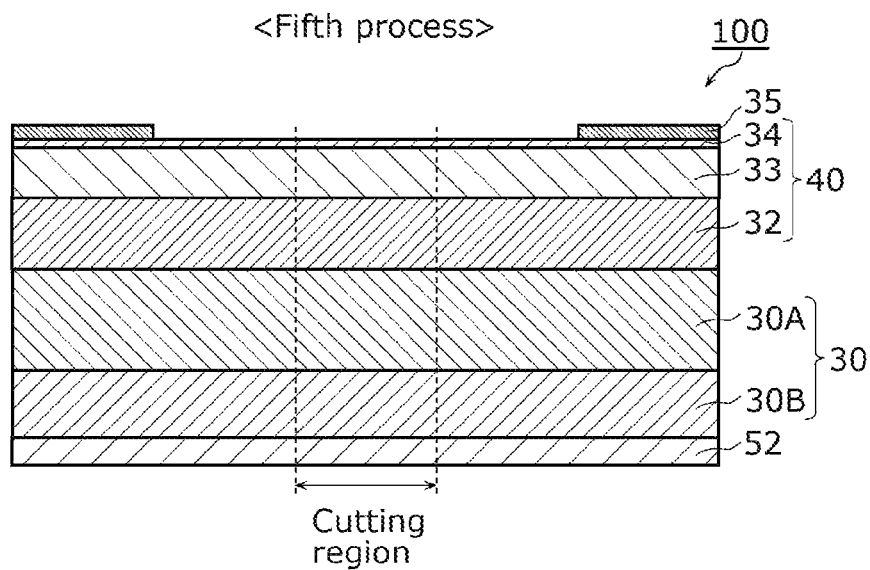
FIG. 3F is a schematic enlarged cross-sectional view of the wafer according to Embodiment 1.

As illustrated in FIG. 3F, a fifth process is a process of applying dicing tape 52 onto the undersurface of metal layer 30 formed in the fourth process. Dicing tape 52 may be, for example, an adhesive tape that includes a polyolefin, an acrylic urethane resin, or an acrylic acid ester copolymer, for instance, as a base material.

Figure 3G:
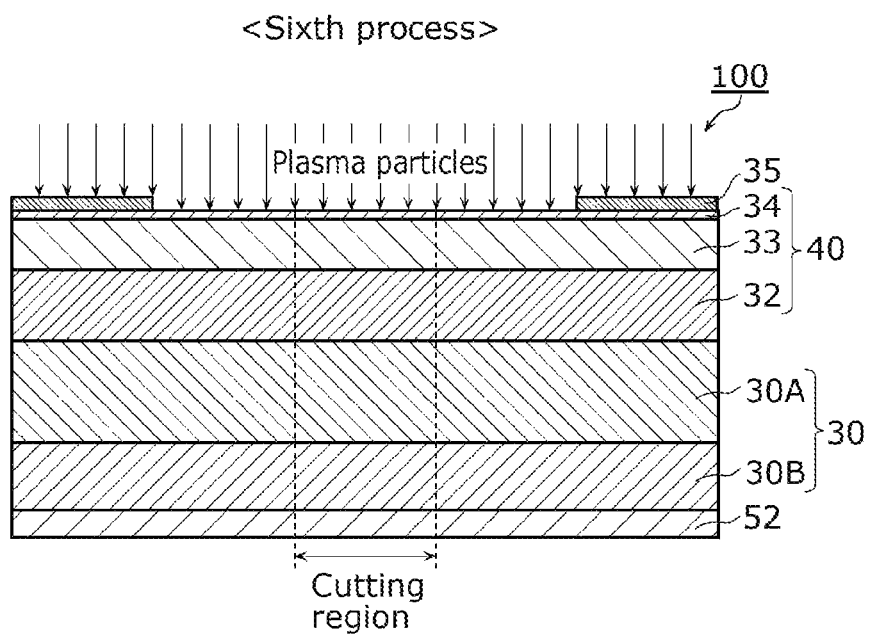
FIG. 3G is a schematic enlarged cross-sectional view of the wafer according to Embodiment 1.

As illustrated in FIG. 3G, a sixth process is a process of increasing hydrophilicity of the surface of wafer 100, which is performed on the upper surface of wafer 100.

The process of increasing hydrophilicity is a process of removing residual surface supporting layer 50 remaining due to not being completely removed from the surface of wafer 100 in the third process, and may be, for example, a plasma treatment for dry cleaning using plasma, an organic solvent cleaning treatment for wet cleaning using an appropriate organic solvent such as acetone, an ultraviolet (UV) irradiation treatment, or an ashing treatment.

Here, the process of increasing hydrophilicity is, for example, a plasma treatment using atmospheric pressure plasma technology in which argon and/or oxygen are the material.

The sixth process allows the entire surface of wafer 100 to be covered with water-soluble protective layer 51 (see FIG. 3H) in a seventh process described later, by making the surface of wafer 100 relatively highly hydrophilic.

As described above, it is difficult to completely remove surface supporting layer 50 formed on the upper surface of wafer 100 in the third process. If surface supporting layer 50 is not completely removed from the surface of wafer 100 and remains thereon, residual surface supporting layer 50 decreases the hydrophilicity of the surface of wafer 100. Accordingly, before the seventh process starts, the sixth process is performed so as to make the surface of wafer 100 relatively highly hydrophilic.

Conversely, if the sixth process is not performed prior to the seventh process, hydrophilicity of the surface of wafer 100 is decreased in the third process, and thus the entire surface of wafer 100 cannot be covered with water-soluble protective layer 51 in the seventh process.

The entire surface of wafer 100 is covered with water-soluble protective layer 51 in the seventh process, and thus a formation that contains metal included in metal layer 30 and is formed due to irradiation with a laser beam in an eighth process described later can be prevented from adhering to the surface of wafer 100.

Figure 3H:
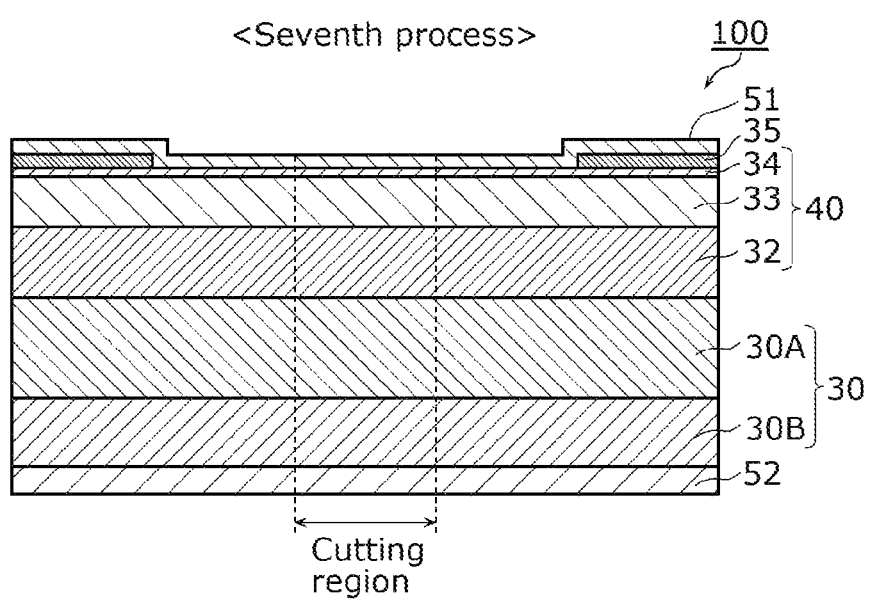
FIG. 3H is a schematic enlarged cross-sectional view of the wafer according to Embodiment 1.

As illustrated in FIG. 3H, the seventh process is a process of forming water-soluble protective layer 51 on the surface of wafer 100.

Water-soluble protective layer 51 is formed on the surface of wafer 100 by applying, onto the surface of wafer 100, a coating that forms water-soluble protective layer 51 using a spin coater, for example.

A coating, that is, water-soluble protective layer 51 may include, for example, 1-methoxy-2-propanol, monopropylene glycol methyl ether.

The spin coater applies a coating by dripping a coating of less than 100 ml onto the surface of wafer 100 while rotating wafer 100 at a rotation speed higher than 500 rpm.

In general, according to the environment in which and a length of a period for which wafer 100 is stored, hydrophilicity of the surface of wafer 100 is gradually lost during a period from when the process of increasing hydrophilicity of the surface of wafer 100 is applied onto the upper surface of wafer 100 in the sixth process until when the seventh process starts. Accordingly, wafer 100 is desirably stored in a managed environment during a period from when the sixth process ends until when the seventh process starts. As an example, wafer 100 is desirably stored in an environment in which at most 5000 0.5-µm particles are present per cubic foot (28.3 liters) during the period from when the sixth process ends until when the seventh process starts, and the seventh process starts before 240 hours elapse after the sixth process ends.

Figure 3I:
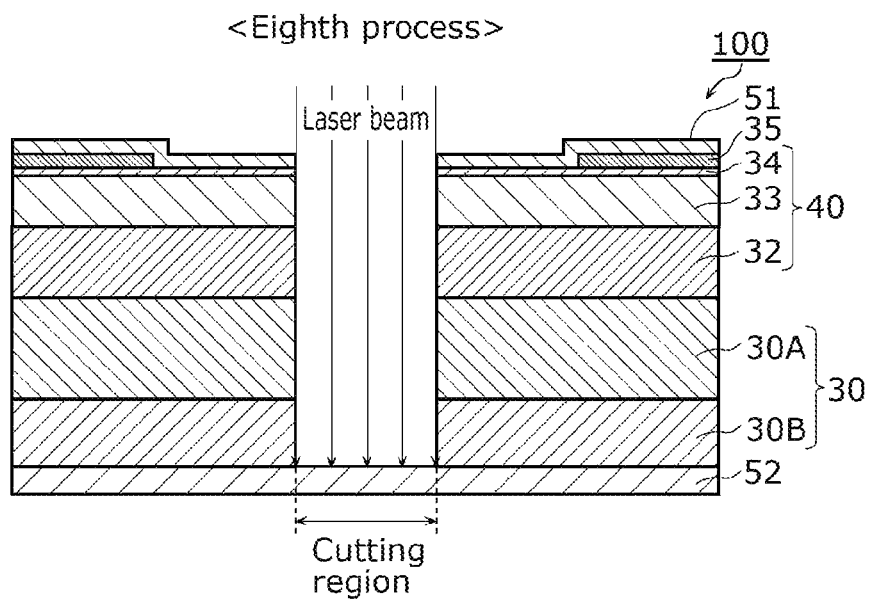
FIG. 3I is a schematic enlarged cross-sectional view of the wafer according to Embodiment 1.

As illustrated in FIG. 3I, the eighth process is a process of cutting wafer 100, first metal layer 30A, and second metal layer 30B by irradiating a cutting region that is a predetermined region of wafer 100 with a laser beam. A laser that emits a laser beam may be a Q-switched laser that emits a laser beam having a wavelength of 355 nm.

Figure 4:
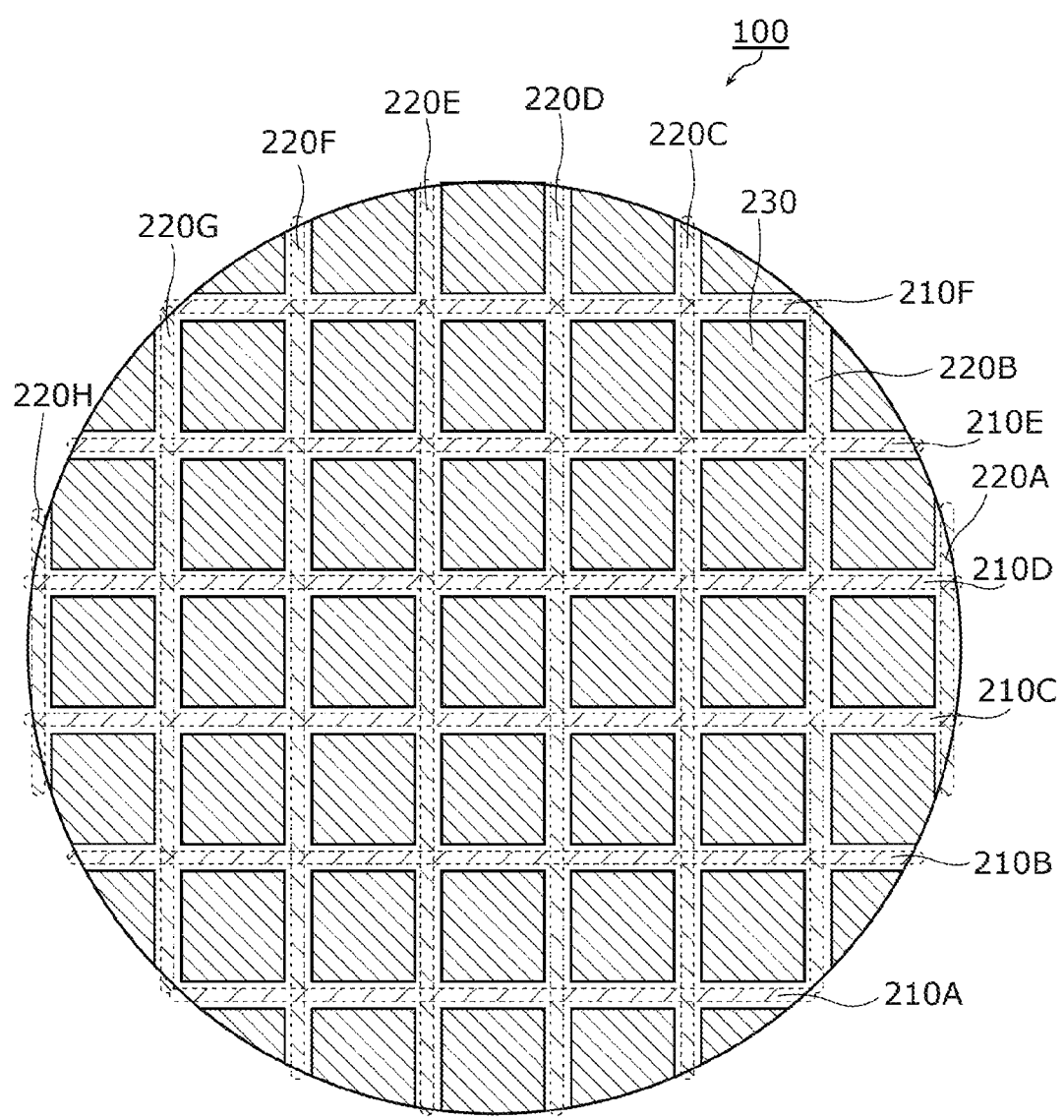
FIG. 4 is a schematic plan view of the wafer according to Embodiment 1.

FIG. 4 is a schematic plan view of wafer 100.

As illustrated in FIG. 4, the cutting region that is the predetermined region of wafer 100 consists of a plurality of streets forming a lattice that divides wafer 100 into a plurality of semiconductor element structures 230 in a plan view of wafer 100. Here, the plurality of streets consist of first streets 210 (here, first streets 210A, 210B, 210C, 210D, 210E, and 210F) that extend in a first direction (here, a lateral direction in FIG. 4) in the plan view of wafer 100, and second streets 220 (here, second streets 220A, 220B, 220C, 220D, 220E, 220F, 220G, and 220H) that extend in a second direction (here, a vertical direction in FIG. 4) orthogonal to the first direction.

The eighth process includes an eleventh process of performing a tenth process a plurality of times, and a thirteenth process of performing a twelfth process a plurality of times. The tenth process performed each of the plurality of times is a process of emitting a laser beam onto each of first streets 210 from one end to the other end thereof or from the other end to the one end thereof, and the thirteenth process performed each of the plurality of times is a process of performing a plurality of times the twelfth process of emitting a laser beam onto each of second streets 220 from one end to the other end thereof or from the other end to the one end thereof.

Here, the eleventh process is a process in which in a period from the start to the end of performing the tenth process the plurality of times on one of first streets 210, a laser beam is prevented from being emitted onto a remaining one or more of first streets 210, and the thirteenth process is a process in which in a period from the start to the end of performing the twelfth process a plurality of times on one of second streets 220, a laser beam is prevented from being emitted onto a remaining one or more of second streets 220.

On wafer 100, first metal layer 30A and second metal layer 30B have a bimetal structure made of two types of metals having different Young's moduli. Thus, if in a state in which wafer 100, first metal layer 30A, and second metal layer 30B in one street are not completely cut, cutting of wafer 100, first metal layer 30A, and second metal layer 30B in the next street is started, the warping stress in the wafer is ununiformly released in the wafer, which may cause displacement of the streets.

As described above, in the eleventh process, the tenth process is performed on one of first streets 210 a plurality of times, and thereafter starts being performed on the next one of first streets 210. Accordingly, wafer 100, first metal layer 30A, and second metal layer 30B in one of first streets 210 are certainly completely cut, and thereafter cutting of wafer 100, first metal layer 30A, and second metal layer 30B in the next one of first streets 210 can be started.

Similarly, in the thirteenth process, the twelfth process is performed on one of second streets 220 a plurality of times, and thereafter starts being performed on the next one of second streets 220. Accordingly, in the thirteenth process, wafer 100, first metal layer 30A, and second metal layer 30B in one of second streets 220 are certainly completely cut, and thereafter cutting of wafer 100, first metal layer 30A, and second metal layer 30B in the next one of second streets 220 can be started.

Accordingly, the eighth process includes the eleventh process and the thirteenth process, and thus in a state in which wafer 100, first metal layer 30A, and second metal layer 30B in one of the streets are not completely cut, cutting of wafer 100, first metal layer 30A, and second metal layer 30B in the next one of the streets can be prevented from being started.

Accordingly, this can reduce the occurrence of the displacement of the streets, which is caused by the release of the warping stress of wafer 100, during the irradiation with a laser beam.

In the eleventh process, the tenth process may be performed a plurality of times on each of first streets 210 in an arrangement direction from first street 210 at an end in the second direction (here, first street 210A) to first street 210 at the other end in the second direction (here, first street 210F). In the thirteenth process, the twelfth process may be performed a plurality of times on each of second streets 220 in an arrangement direction from second street 220 at an end in the first direction (here, second street 220A) to second street 220 at the other end in the first direction (here, second street 220H).

Accordingly, wafer 100, first metal layer 30A, and second metal layer 30B in first streets 210 can be efficiently cut, and wafer 100, first metal layer 30A, and second metal layer 30B in second streets 220 can be efficiently cut.

The following describes a specific example of the eighth process that is not necessarily limiting, with reference to the drawings. The specific example described here is of a case where wafer 100, first metal layer 30A, and second metal layer 30B in one of first streets 210 can be certainly completely cut by performing the tenth process twice on the one of first streets 210, and wafer 100, first metal layer 30A, and second metal layer 30B in one of second streets 220 can be certainly completely cut by performing the twelfth process twice on the one of second streets 220.

Figure 5A:
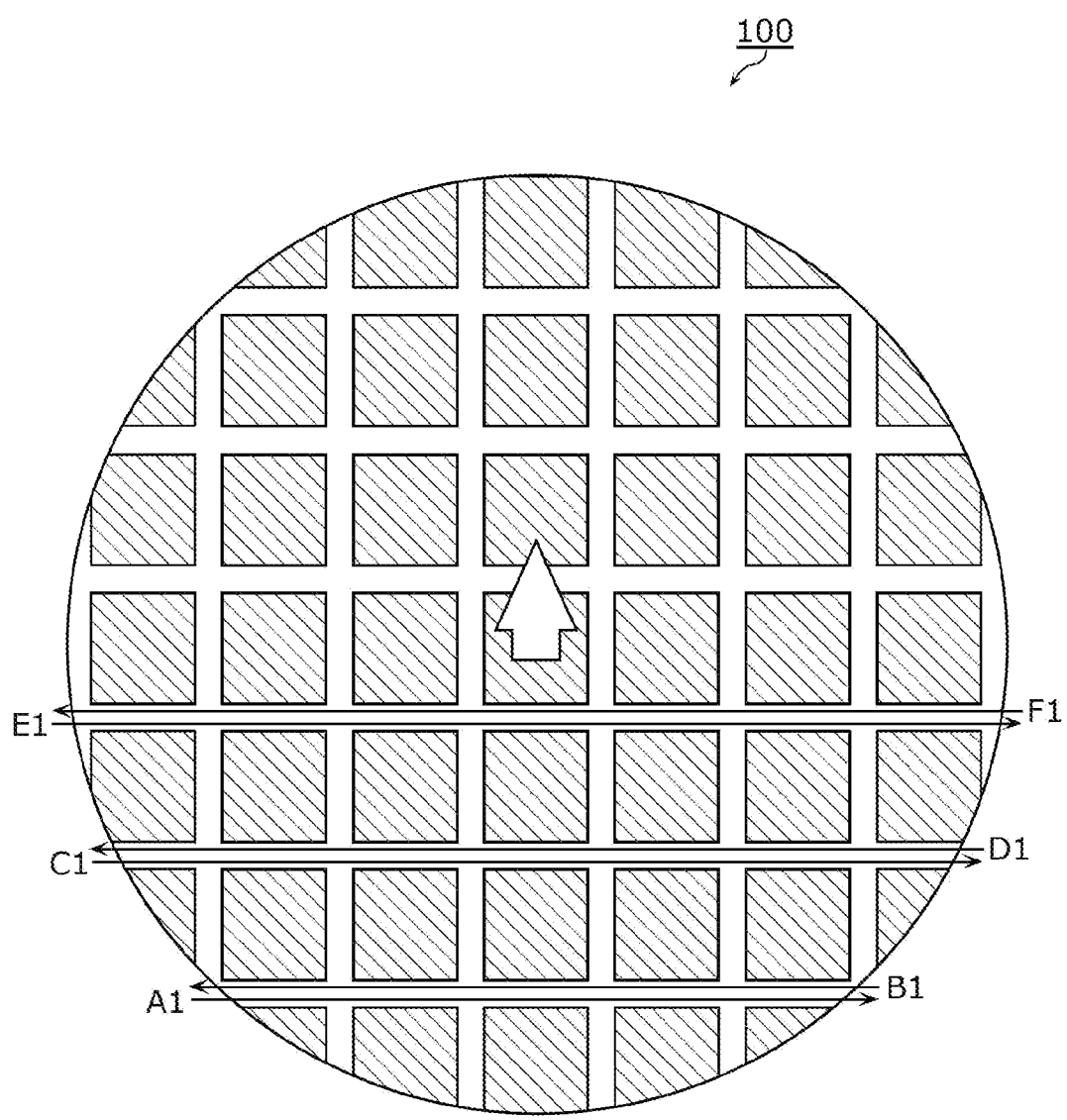
FIG. 5A is a schematic plan view illustrating an example of a state in which an upper surface of the wafer is irradiated with a laser beam in an eighth process according to Embodiment 1.
Figure 5B:
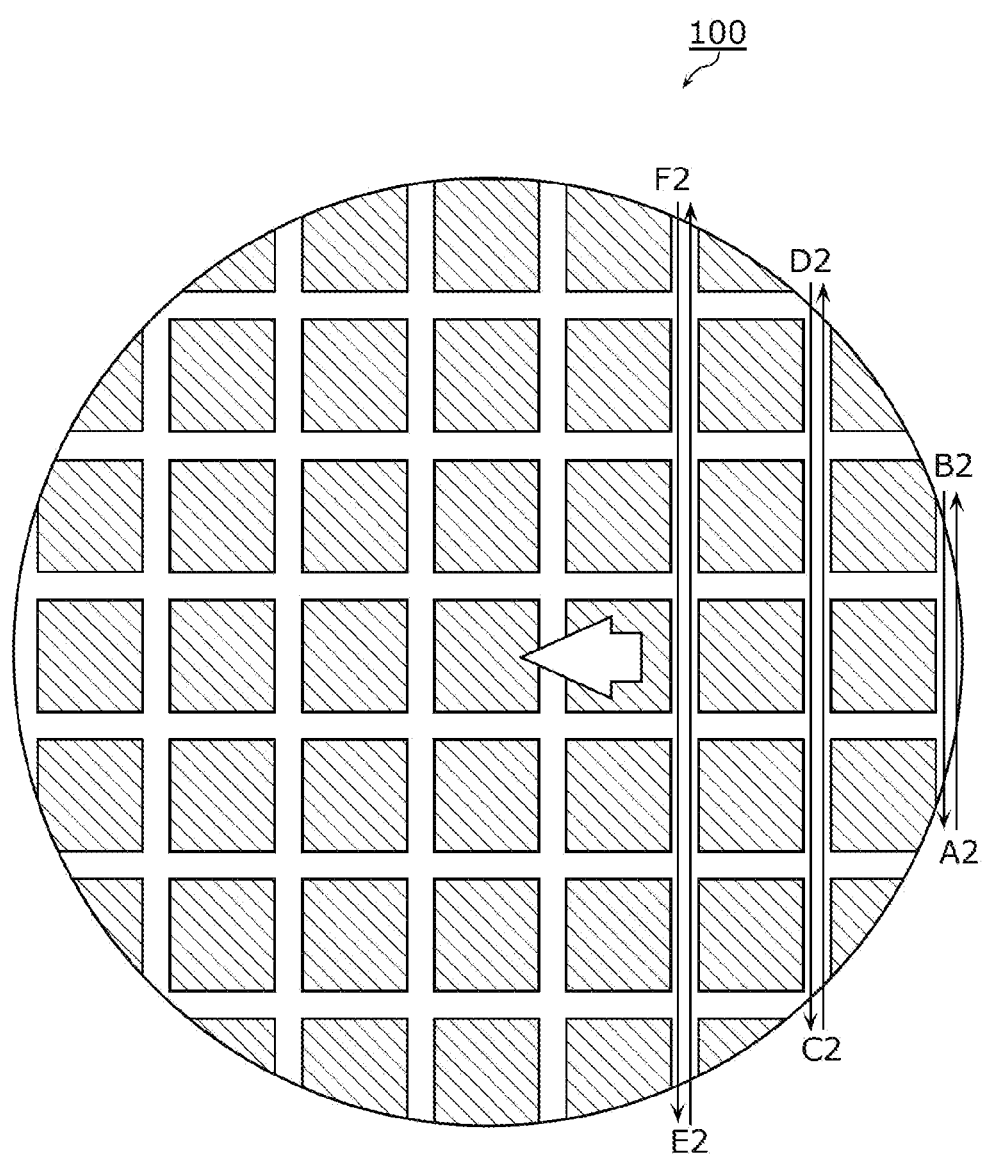
FIG. 5B is a schematic plan view illustrating an example of a state in which the upper surface of the wafer is irradiated with a laser beam in the eighth process according to Embodiment 1.

FIG. 5A and FIG. 5B are each a schematic plan view illustrating an example of a state in which the upper surface of wafer 100 is irradiated with a laser beam in the eighth process.

First, in the eighth process, the tenth process is performed on first streets 210 in the order of A1, B1, C1, D1, E1, F1, and so on, as illustrated in FIG. 5A.

More specifically, in the eighth process, firstly, a first forward irradiation process (A1 in FIG. 5A) of emitting a laser beam onto first street 210A is performed once from one end to the other end, and subsequently a first backward irradiation process (B1 in FIG. 5A) of emitting a laser beam onto first street 210A is performed once from the other end to the one end. Next, a first forward irradiation process (C1 in FIG. 5A) of emitting a laser beam onto first street 210B is performed once from one end to the other end, and subsequently a first backward irradiation process (D1 in FIG. 5A) of emitting a laser beam onto first street 210B is performed once from the other end to the one end. Next, a first forward irradiation process (E1 in FIG. 5A) of emitting a laser beam onto first street 210C is performed once from one end to the other end, and subsequently a first backward irradiation process (F1 in FIG. 5A) of emitting a laser beam onto first street 210C is performed once from the other end to the one end.

In this manner, the first forward irradiation process and the first backward irradiation process are each performed once on each first street 210 in an arrangement direction from first street 210 at an end in the second direction (here, first street 210A) to first street 210 at the other end in the second direction (here, first street 210F), to cut first streets 210.

In this manner, when wafer 100, first metal layer 30A, and second metal layer 30B are certainly completely cut by performing the tenth process twice on one first street 210, the first forward irradiation process and the first backward irradiation process are each performed once on each of first streets 210 to efficiently perform the tenth process twice in total.

Here, a condition under which the laser beam is emitted in the first forward irradiation process and a condition under which the laser beam is emitted in the first backward irradiation process may be same.

Accordingly, it is unnecessary to change the condition for irradiation with a laser beam in the eleventh process.

First metal layer 30A may be cut in a preceding one of the first forward irradiation process and the first backward irradiation process (here, the first forward irradiation process).

Next, in the eighth process, the twelfth process is performed on second streets 220 in the order of A2, B2, C2, D2, E2, F2, and so on, as illustrated in FIG. 5B.

More specifically, in the eighth process, firstly, a second forward irradiation process (A2 in FIG. 5B) of emitting a laser beam onto second street 220A is performed once from one end to the other end, and subsequently a second backward irradiation process (B2 in FIG. 5B) of emitting a laser beam onto second street 220A is performed once from the other end to the one end. Next, a second forward irradiation process (C2 in FIG. 5B) of emitting a laser beam onto second street 220B is performed once from one end to the other end, and subsequently a second backward irradiation process (D2 in FIG. 5B) of emitting a laser beam onto second street 220B is performed once from the other end to the one end. Next, a second forward irradiation process (E2 in FIG. 5B) of emitting a laser beam onto second street 220C is performed once from one end to the other end, and subsequently a second backward irradiation process (F2 in FIG. 5B) of emitting a laser beam onto second street 220C is performed once from the other end to the one end.

In this manner, the second forward irradiation process and the second backward irradiation process are each performed once on each second street 220 in an arrangement direction from second street 220 at an end in the first direction (here, second street 220A) to second street 220 at the other end in the first direction (here, second street 220H), to cut second streets 220.

In this manner, when wafer 100, first metal layer 30A, and second metal layer 30B are certainly completely cut by performing the twelfth process twice on one second street 220, the second forward irradiation process and the second backward irradiation process are each performed once on each of second streets 220 to efficiently perform the twelfth process twice in total.

Here, a condition under which the laser beam is emitted in the second forward irradiation process and a condition under which the laser beam is emitted in the second backward irradiation process may be same.

Accordingly, it is unnecessary to change the condition for irradiation with a laser beam in the thirteenth process.

First metal layer 30A may be cut in a preceding one of the second forward irradiation process and the second backward irradiation process (here, the second forward irradiation process).

Note that when wafer 100, first metal layer 30A, and second metal layer 30B cannot be certainly completely cut by performing the tenth process twice on each of first streets 210, the first forward irradiation process and the first backward irradiation process may each be performed one or more times so that the number of times the tenth process is performed on each of first streets 210 is adjusted to the number of times wafer 100, first metal layer 30A, and second metal layer 30B are certainly completely cut.

Similarly, when wafer 100, first metal layer 30A, and second metal layer 30B cannot be certainly completely cut by performing the twelfth process twice on each of second streets 220, the second forward irradiation process and the second backward irradiation process may each be performed one or more times so that the number of times the twelfth process is performed on each of second streets 220 is adjusted to the number of times wafer 100, first metal layer 30A, and second metal layer 30B are certainly completely cut.

At this time, a condition under which the laser beam is emitted in the first forward irradiation process and a condition under which the laser beam is emitted in the first backward irradiation process may be same, and a condition under which the laser beam is emitted in the second forward irradiation process and a condition under which the laser beam is emitted in the second backward irradiation process may be same.

In the eighth process, when metal layer 30 is cut by being irradiated with a laser beam, a phenomenon that formations that contain metal included in metal layer 30 are scattered, and a phenomenon that a formation is produced by metal once liquefied or vaporized due to heat from irradiation with a laser beam being cooled again and hardened.

Figure 6:
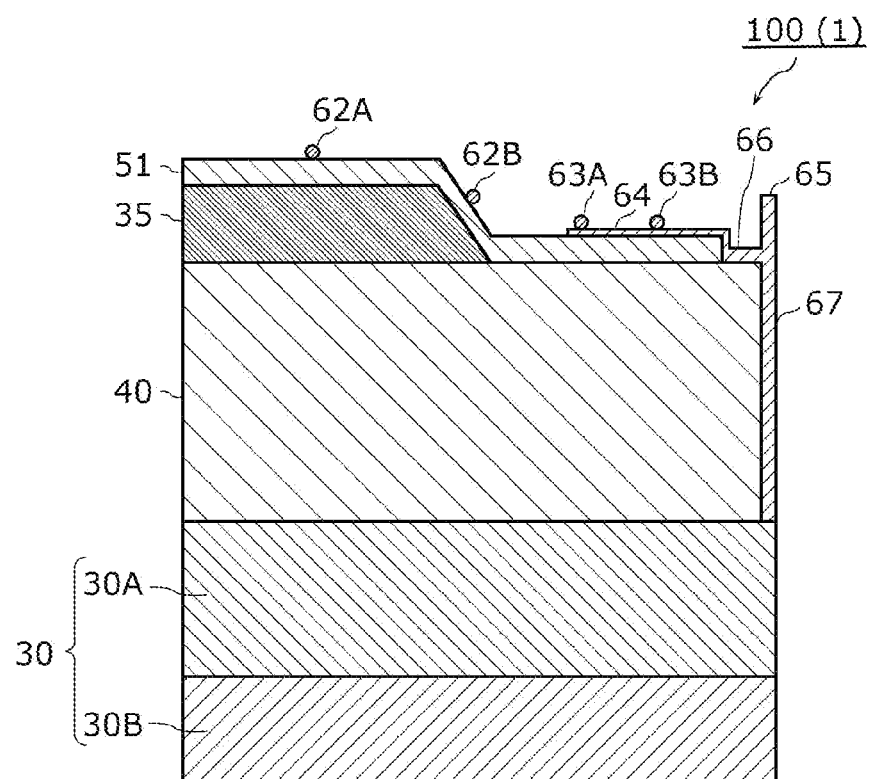
FIG. 6 is a schematic enlarged cross-sectional view of the semiconductor device according to Embodiment 1.

FIG. 6 is a schematic enlarged cross-sectional view of wafer 100 cut by being irradiated with a laser beam, that is, semiconductor device 1 separated by the first chip singulation method. FIG. 6 illustrates a state in which formations (hereinafter, also referred to as "debris") that contain metal included in metal layer 30 are formed by the above phenomenon.

In FIG. 6, debris 62 (debris 62A and debris 62B in FIG. 6) is adhering onto water-soluble protective layer 51 on the surface of protective layer 35, out of formations scattered by irradiation with a laser beam. Note that debris is also generated by irradiating semiconductor layer 40 with a laser beam. Stated differently, the material of debris is not limited only to metals, and may include a semiconductor such as silicon.

Debris 63 (debris 63A and debris 63B in FIG. 6) is adhering onto water-soluble protective layer 51 on the surface of semiconductor layer 40, out of formations scattered by irradiation with a laser beam.

Debris 64 is like a film resulting from formations that are adhering onto water-soluble protective layer 51 on the surface of semiconductor layer 40 being contiguous and deposited, out of formations scattered by irradiation with a laser beam.

Debris 65 is formed by metal, which has once been liquefied or vaporized due to heat from irradiation with a laser beam, being stretched by suction air generated by the air being sucked from above and extending upward along the cut surface, and then cooled and hardened.

Debris 66 is formed by metal, which has once been liquefied or vaporized due to heat from irradiation with a laser beam, extending toward the surface of protective layer 35 and being cooled and hardened in a region in which water-soluble protective layer 51 is eliminated by irradiation with a laser beam.

Debris 67 is formed by metal, which has once been liquefied or vaporized due to heat from irradiation with a laser beam, being cooled and hardened on the side surface of semiconductor layer 40 and the side of metal layer 30.

Figure 3J:
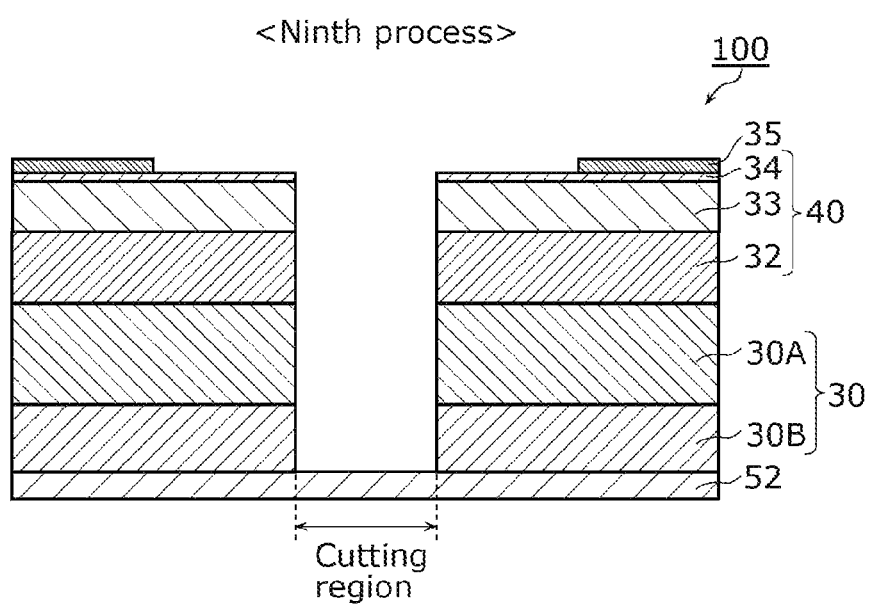
FIG. 3J is a schematic enlarged cross-sectional view of the wafer according to Embodiment 1.

As illustrated in FIG. 3J, the ninth process is a process of removing water-soluble protective layer 51 from the surface of wafer 100 using wash water. Debris adhering onto water-soluble protective layer 51 is removed from the surface of wafer 100, together with water-soluble protective layer 51 in the ninth process.

The ninth process is performed by emitting a jet of wash water having a predetermined water pressure onto the upper surface of rotating wafer 100. At this time, it is preferable to change the level of the predetermined water pressure two or more times to adjust the pressure in the ninth process, to efficiently remove water-soluble protective layer 51.

Figure 7:
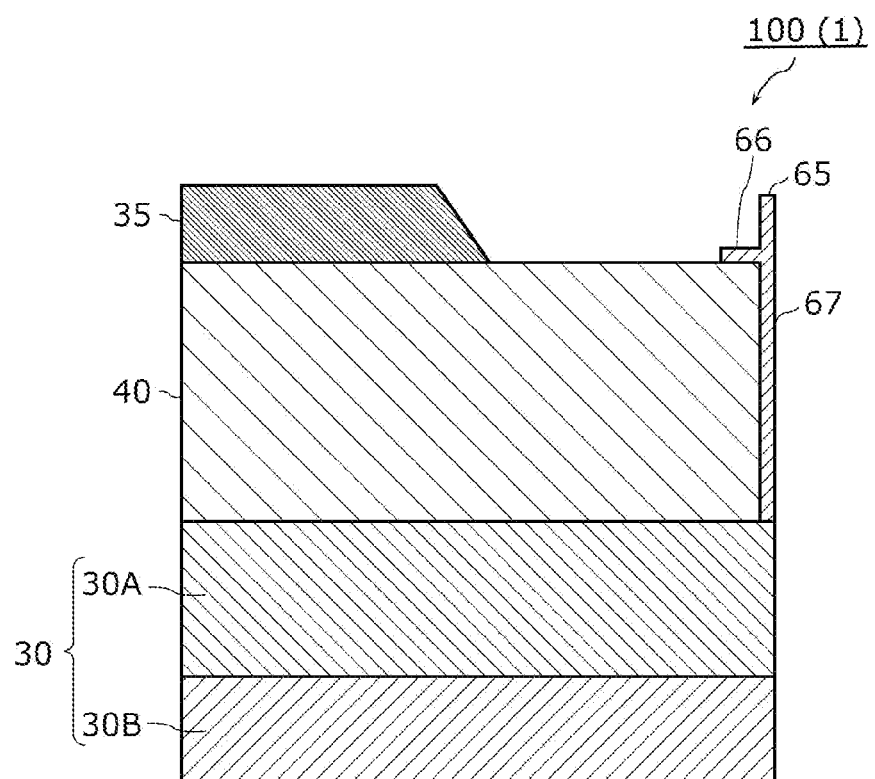
FIG. 7 is a schematic enlarged cross-sectional view of the semiconductor device according to Embodiment 1.

FIG. 7 is a schematic enlarged cross-sectional view of wafer 100, that is, semiconductor device 1 separated by the first chip singulation method when the ninth process ends.

As can be seen from a comparison between FIG. 6 and FIG. 7, debris 65, debris 66, and debris 67 may not be removed and remain, yet debris 62, debris 63, and debris 64 are removed together with water-soluble protective layer 51 in the ninth process.

[1-3. Consideration]

As described above, wafer 100 can be diced without using a blade according to the first chip singulation method.

Further, as described above, adhesion of a formation that contains metal included in metal layer 30 is reduced in semiconductor device 1 separated by the first chip singulation method. Thus, the first chip singulation method provides semiconductor device 1 in which adhesion of a formation that contains metal included in metal layer 30 is reduced.

Embodiment 2

The following describes a semiconductor device according to Embodiment 2 obtained by partially changing the configuration of semiconductor device 1 according to Embodiment 1.

[2-1. Structure of Semiconductor Device]

As described above, semiconductor device 1 according to Embodiment 1 is produced by dicing wafer 100 by the first chip singulation method. In contrast, a semiconductor device according to Embodiment 2 is produced by being separated from wafer 100 by a second chip singulation method resulting from changing some of the processes of the first chip singulation method. Accordingly, the semiconductor device according to Embodiment 2 separated by the second chip singulation method differs from semiconductor device 1 in the shapes of semiconductor substrate 32, low-concentration impurity layer 33, oxide film 34, and water-soluble protective layer 51. Thus, semiconductor substrate 32 is referred to as semiconductor substrate 32A, low-concentration impurity layer 33 is referred to as low-concentration impurity layer 33A, oxide film 34 is referred to as oxide film 34A, and water-soluble protective layer 51 is referred to as water-soluble protective layer 51A in Embodiment 2. Along with this, semiconductor layer 40 is referred to as semiconductor layer 40A, and wafer 100 is referred to as wafer 100A.

[2-2. Chip Singulation Method of Separating Semiconductor Device]

The following describes the second chip singulation method for separating the semiconductor device according to Embodiment 2 from wafer 100A.

The second chip singulation method includes a twenty-first process to a thirtieth process in the order. Out of the processes, the twenty-first process to a twenty-seventh process are equivalent to the first process to the seventh process, respectively, in the first chip singulation method according to Embodiment 1, in which wafer 100 is replaced with wafer 100A, semiconductor substrate 32 is replaced with semiconductor substrate 32A, low-concentration impurity layer 33 is replaced with low-concentration impurity layer 33A, oxide film 34 is replaced with oxide film 34A, water-soluble protective layer 51 is replaced with water-soluble protective layer 51A, and semiconductor layer 40 is replaced with semiconductor layer 40A.

Accordingly, description of the twenty-first process to the twenty-seventh process is assumed to be already given and thus is omitted, and a twenty-eighth process to the thirtieth process are to be described herein.

Figure 8A:
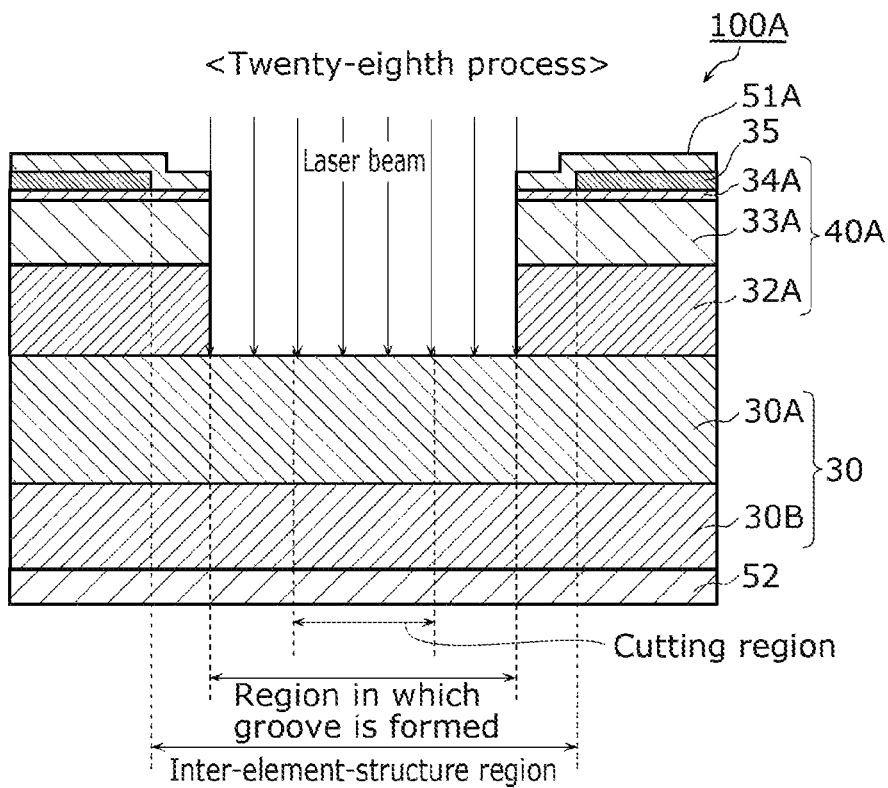
FIG. 8A is a schematic enlarged cross-sectional view of a wafer according to Embodiment 2.
Figure 8B:
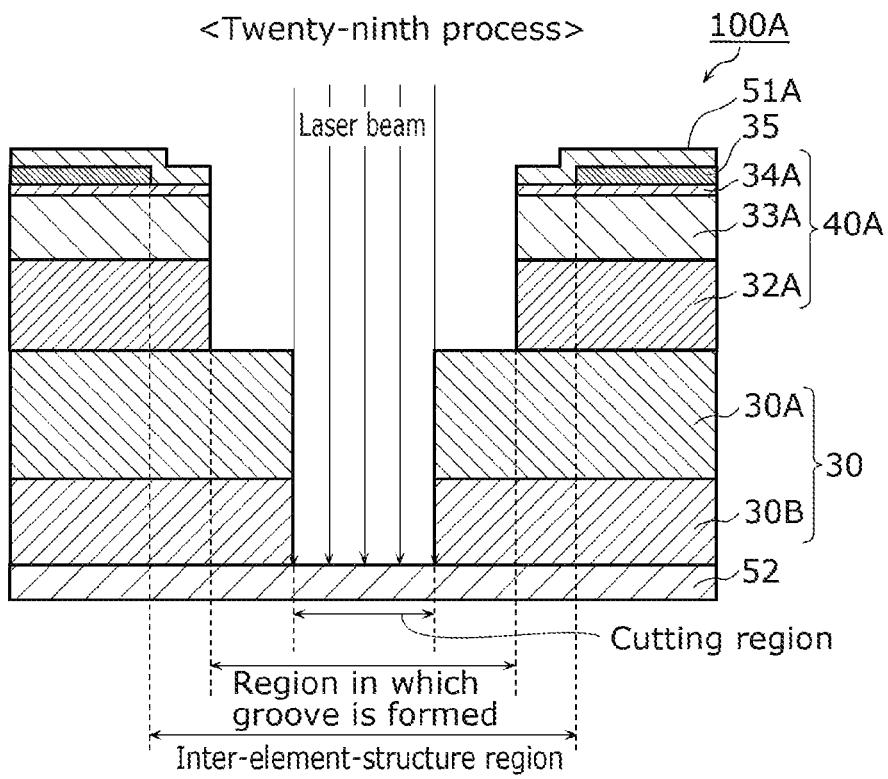
FIG. 8B is a schematic enlarged cross-sectional view of the wafer according to Embodiment 2.
Figure 8C:
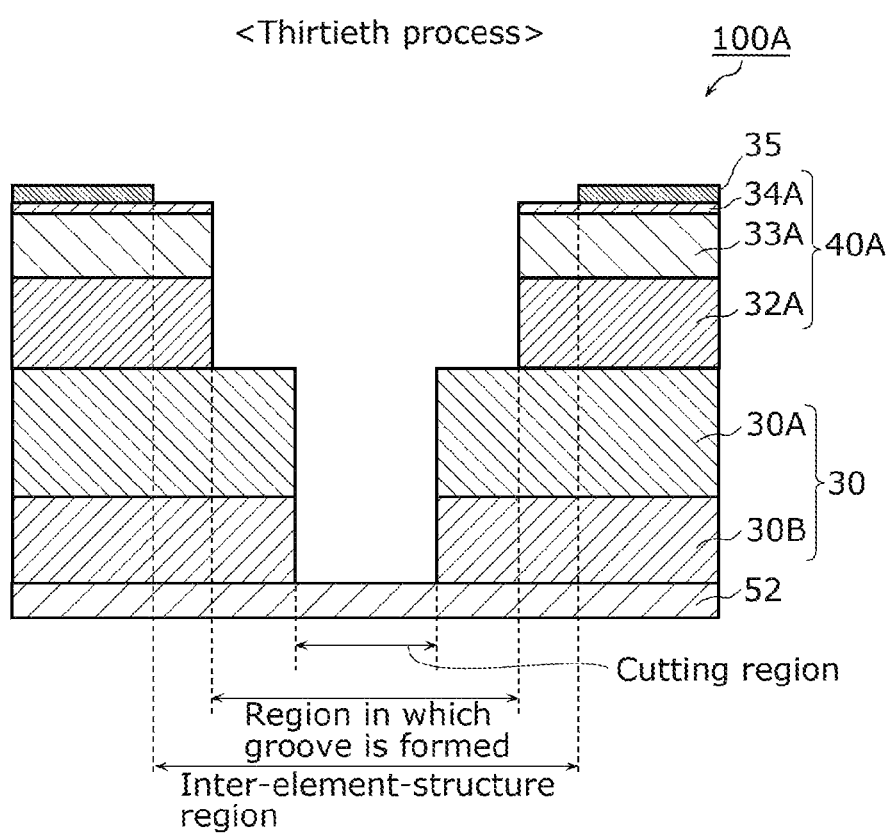
FIG. 8C is a schematic enlarged cross-sectional view of the wafer according to Embodiment 2.

FIG. 8A to FIG. 8C are schematic enlarged cross-sectional views each illustrating a cutting region and therearound of wafer 100A in the twenty-eighth process to the thirtieth process, respectively.

As illustrated in FIG. 8A, the twenty-eighth process is a process of forming a groove in an inter-element-structure region between adjacent ones of a plurality of semiconductor element structures in the upper surface of wafer 100A. As illustrated in FIG. 8A, the twenty-eighth process is a process of forming a groove in the inter-element-structure region by irradiating, with a laser beam, a region in which a groove is to be formed in the upper surface of wafer 100A, for example. Here, as illustrated in FIG. 8A, the cutting region is included in a region inside the groove.

In general, if a wafer is irradiated with a laser beam having output power for cutting a metal layer (here, first metal layer 30A and second metal layer 30B), a region referred to as a HAZ resulting from properties of semiconductor crystals being altered by the influence of heat from the laser beam is often formed in the vicinity of the cutting region of the wafer.

Since the twenty-eighth process is performed prior to a twenty-ninth process later described, a region in which a HAZ, which is formed due to a laser beam in the twenty-ninth process, may be generated can be removed in advance through the twenty-eighth process.

Accordingly, this provides a semiconductor device in which formation of a HAZ is reduced.

As illustrated in FIG. 8B, the twenty-ninth process is a process of cutting metal layer 30 by irradiating a cutting region that is a predetermined region of wafer 100A with a laser beam. The twenty-ninth process is equivalent to the eighth process in the first chip singulation method according to Embodiment 1, in which wafer 100 is replaced with wafer 100A, semiconductor substrate 32 is replaced with semiconductor substrate 32A, low-concentration impurity layer 33 is replaced with low-concentration impurity layer 33A, oxide film 34 is replaced with oxide film 34A, water-soluble protective layer 51 is replaced with water-soluble protective layer 51A, and semiconductor layer 40 is replaced with semiconductor layer 40A.

As illustrated in FIG. 8C, the thirtieth process is a process of removing water-soluble protective layer 51A from the surface of wafer 100A using wash water. The thirtieth process is equivalent to the ninth process in the first chip singulation method according to Embodiment 1, in which wafer 100 is replaced with wafer 100A, semiconductor substrate 32 is replaced with semiconductor substrate 32A, low-concentration impurity layer 33 is replaced with low-concentration impurity layer 33A, oxide film 34 is replaced with oxide film 34A, water-soluble protective layer 51 is replaced with water-soluble protective layer 51A, and semiconductor layer 40 is replaced with semiconductor layer 40A.

[2-3. Consideration]

As described above, wafer 100A can be diced without using a blade according to the second chip singulation method.

Further, as described above, formation of a HAZ is reduced in the semiconductor device separated by the second chip singulation method. Thus, the second chip singulation method provides a semiconductor device in which formation of a HAZ is reduced.

Embodiment 3

The following describes a semiconductor device according to Embodiment 3 obtained by partially changing the configuration of semiconductor device 1 according to Embodiment 1.

[3-1. Structure of Semiconductor Device]

As described above, semiconductor device 1 according to Embodiment 1 is produced by dicing wafer 100 by the first chip singulation method. In contrast, a semiconductor device according to Embodiment 3 is produced by being separated from wafer 100 by a third chip singulation method resulting from changing some of the processes of the first chip singulation method. Accordingly, the semiconductor device according to Embodiment 3 separated by the third chip singulation method differs from semiconductor device 1 in the shapes of semiconductor substrate 32, low-concentration impurity layer 33, oxide film 34, and water-soluble protective layer 51. Thus, semiconductor substrate 32 is referred to as semiconductor substrate 32B, low-concentration impurity layer 33 is referred to as low-concentration impurity layer 33B, oxide film 34 is referred to as oxide film 34B, and water-soluble protective layer 51 is referred to as water-soluble protective layer 51B in Embodiment 3. Along with this, semiconductor layer 40 is referred to as semiconductor layer 40B, and wafer 100 is referred to as wafer 100B.

[3-2. Chip Singulation Method of Separating Semiconductor Device]

The following describes the third chip singulation method for separating the semiconductor device according to Embodiment 3 from wafer 100B.

The third chip singulation method includes a forty-first process to a fiftieth process in the order. Out of the processes, the forty-first process to a forty-eighth process are equivalent to the first process to the eighth process, respectively, in the first chip singulation method according to Embodiment 1, in which wafer 100 is replaced with wafer 100B, semiconductor substrate 32 is replaced with semiconductor substrate 32B, low-concentration impurity layer 33 is replaced with low-concentration impurity layer 33B, oxide film 34 is replaced with oxide film 34B, water-soluble protective layer 51 is replaced with water-soluble protective layer 51B, and semiconductor layer 40 is replaced with semiconductor layer 40B. Accordingly, description of the forty-first process to the forty-eighth process is assumed to be already given and thus is omitted, and a forty-ninth process to the fiftieth process are to be described herein.

Figure 9A:
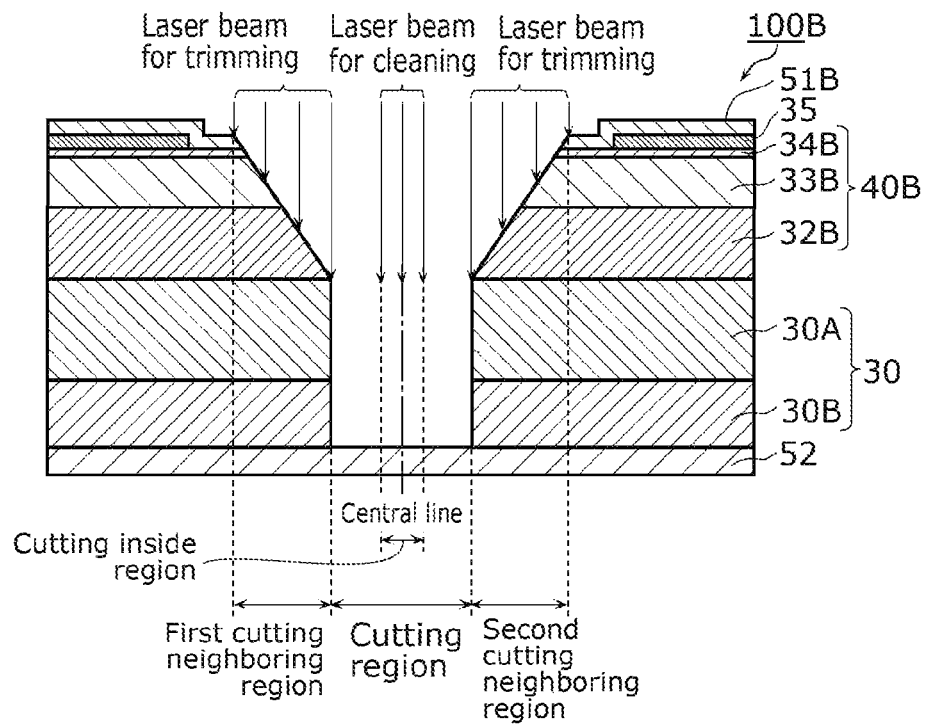
FIG. 9A is a schematic enlarged cross-sectional view of a wafer according to Embodiment 3.
Figure 9B:
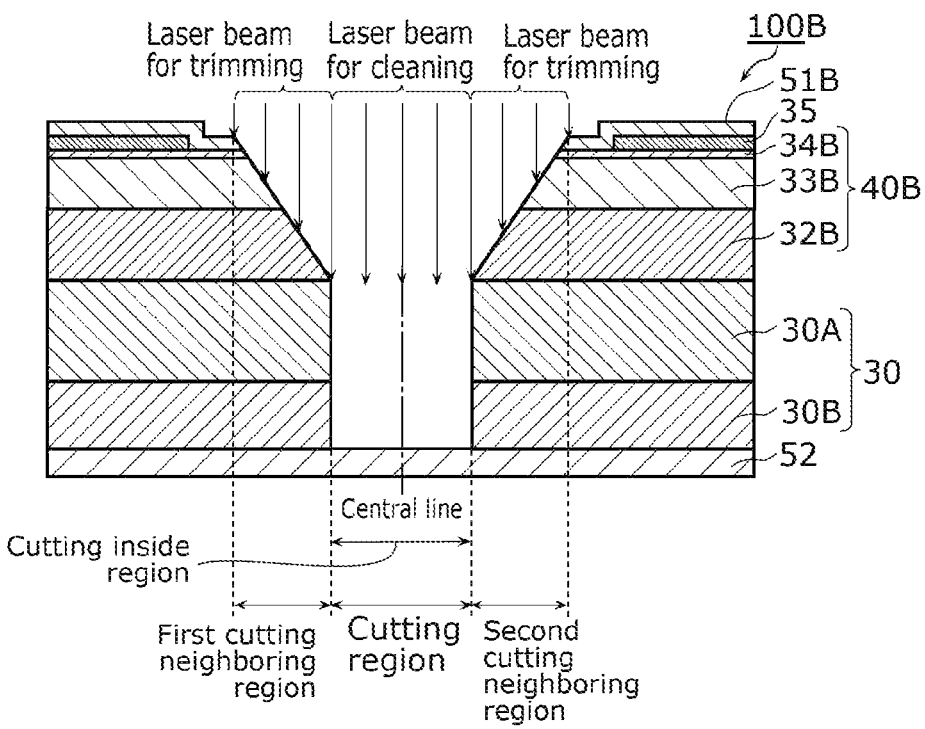
FIG. 9B is a schematic enlarged cross-sectional view of the wafer according to Embodiment 3.
Figure 9C:
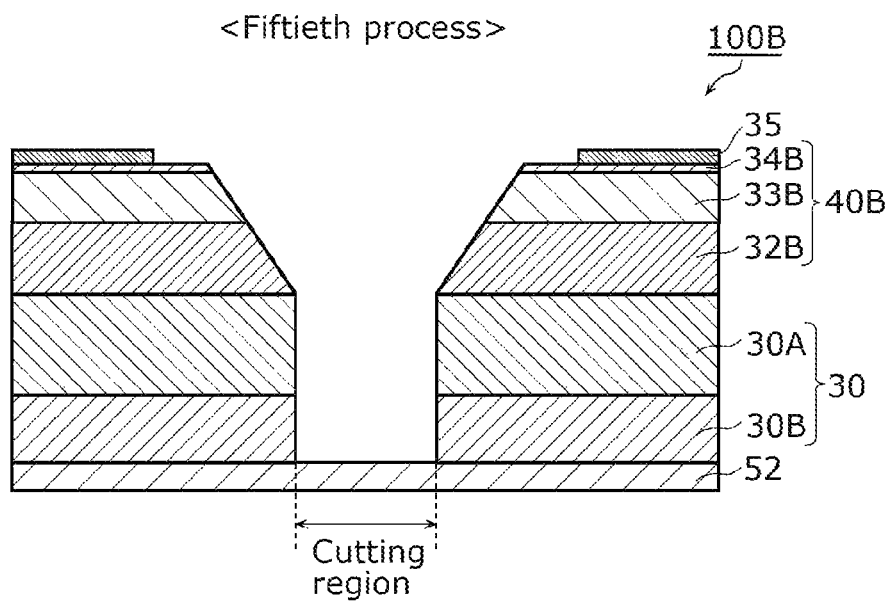
FIG. 9C is a schematic enlarged cross-sectional view of the wafer according to Embodiment 3.

FIG. 9A, FIG. 9B, and FIG. 9C are schematic enlarged cross-sectional views each illustrating a cutting region and therearound of wafer 100B in the forty-ninth process to the fiftieth process, respectively.

As illustrated in FIG. 9A, the forty-ninth process is a process of irradiating cutting neighboring regions (a first cutting neighboring region and a second cutting neighboring region, here) lying, in a plan view of wafer 100B, in predetermined areas on the sides of a central line of the cutting region that is cut in the eighth process with a laser beam for trimming (hereinafter, also referred to as a "second laser beam"), and also irradiating a cutting inside region included in the cutting region, in the plan view of wafer 100B, with a laser beam for cleaning (hereinafter, also referred to as a "third laser beam").

Since the forty-ninth process is performed after the eighth process, a HAZ formed by irradiation with a laser beam (hereinafter referred to as a "first laser beam") in the eighth process can be removed by irradiation with the second laser beam in the forty-ninth process. A reason for referring the second laser beam as a laser beam for trimming is because a purpose of removing a portion in which a HAZ is highly likely generated is accomplished as a main function.

On the other hand, a formation that contains metal included in metal layer 30 often adheres as a burr to the inside of the cutting region in the plan view of wafer 100B, due to irradiation with the second laser beam in the forty-ninth process.

Figure 9D:
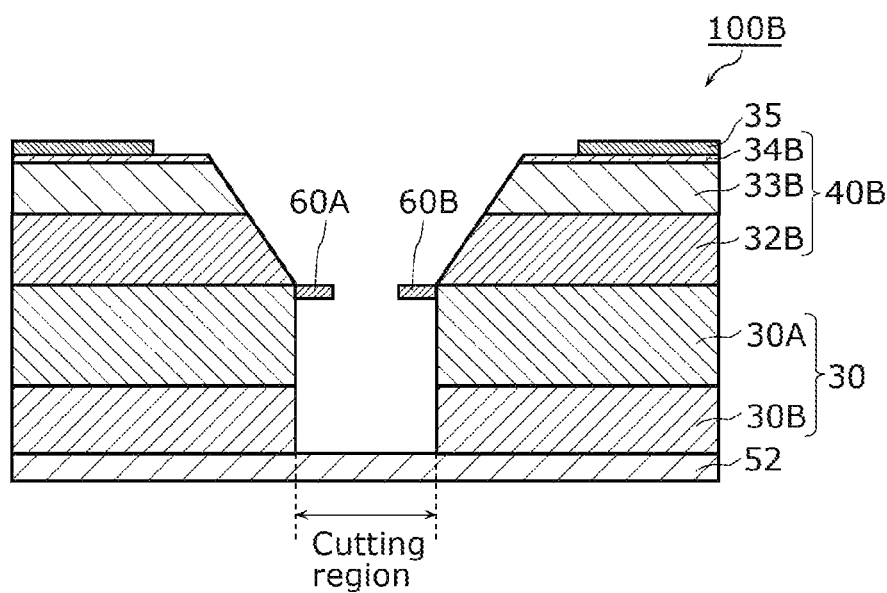
FIG. 9D is a schematic enlarged cross-sectional view of the wafer according to Embodiment 3.

FIG. 9D is a schematic enlarged cross-sectional view of a cutting region and therearound of wafer 100B in an assumed case where only the second laser beam is emitted and the third laser beam is not emitted in the forty-ninth process.

As illustrated in FIG. 9D, in the forty-ninth process, when only the second laser beam is emitted, and the third laser beam is not emitted, formations that contain metal included in metal layer 30 may often adhere, as burr 60A and burr 60B, on the inside of the cutting region in the plan view of wafer 100B.

In contrast, in the forty-ninth process that is actually performed, the second laser beam and the third laser beam are emitted, and thus burrs as above can be removed through the irradiation with the third laser beam.

Accordingly, since the forty-ninth process is performed after the eighth process, a semiconductor device in which formation of a HAZ and adhesion of such a burr are reduced.

Here, as an example that is not necessarily limiting, the first laser beam, the second laser beam, and the third laser beam may be output from a single laser beam output device.

Accordingly, the third chip singulation method can be performed using a single laser beam output device.

In the following, a description is given assuming that the light source of the first laser beam, the second laser beam, and the third laser beam is a single laser beam output device.

Note that in the forty-ninth process, as illustrated in FIG. 9B, the width of a region irradiated with the third laser beam may be extended to the width of the cutting region, or in other words, the width of the cutting inside region may be extended to the width of the cutting region, and the cutting region may be irradiated with the third laser beam. Accordingly, the entire cutting region can be cleaned.

Figure 10:
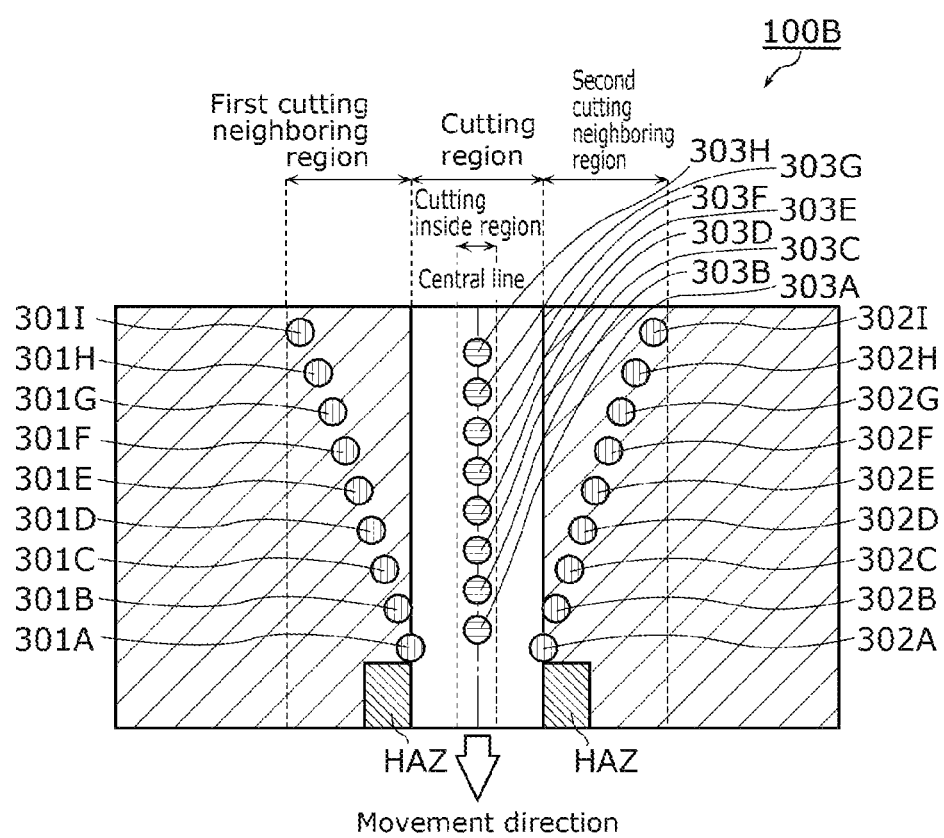
FIG. 10 is a schematic enlarged plan view illustrating an example of a state in which an upper surface of the wafer is irradiated with a second laser beam and a third laser beam in a forty-ninth process according to Embodiment 3.

FIG. 10 is a schematic enlarged plan view of wafer 100B illustrating an example of a state in which the upper surface of wafer 100B is irradiated with the second laser beam and the third laser beam in the forty-ninth process.

As illustrated in FIG. 10, the cutting neighboring regions include: a first cutting neighboring region on one of the sides of the central line; and a second cutting neighboring region on another of the sides of the central line. When the cutting neighboring regions are irradiated with the second laser beam, the first cutting neighboring region is irradiated with a plurality of (here, nine) first irradiation spotlights 301 (here, first irradiation spotlights 301A, 301B, 301C, 301D, 301E, 301F, 301G, 301H, and 301I), and the second cutting neighboring region is irradiated with a plurality of (here, nine, as an example) second irradiation spotlights 302 (here, second irradiation spotlights 302A, 302B, 302C, 302D, 302E, 302F, 302G, 302H, and 302I), the plurality of first irradiation spotlights 301 resulting from a portion of a laser beam output by the single laser beam output device being split, the plurality of second irradiation spotlights 302 result-ing from a portion of a laser beam output by the single laser beam output device being split. When the cutting inside region is irradiated with the third laser beam, the cutting inside region is irradiated with a plurality of (here, eight) third irradiation spotlights 303 (here, third irradiation spotlights 303A, 303B, 303C, 303D, 303E, 303F, 303G, and 303H) resulting from a portion of a laser beam output by the single laser beam output device being split.

Note that the number of first irradiation spotlights 301 and the number of second irradiation spotlights 302 are each not necessarily limited to nine as illustrated in FIG. 10. Furthermore, the number of third irradiation spotlights 303 is not necessarily limited to eight as illustrated in FIG. 10.

As illustrated in FIG. 10, in the forty-ninth process, in the plan view of wafer 100B, the plurality of first irradiation spotlights 301, the plurality of second irradiation spotlights 302, and the plurality of third irradiation spotlights 303 are moved or wafer 100B is moved to extend, relative to wafer 100B, portions irradiated with the plurality of first irradiation spotlights 301, the plurality of second irradiation spotlights 302, and the plurality of third irradiation spotlights 303 in a cutting direction of the cutting region.

Here, as illustrated in FIG. 10, in the plan view of wafer 100B, the plurality of first irradiation spotlights 301 and the plurality of second irradiation spotlights 302 are axisymmetric in respect to the central line of the cutting region serving as a symmetric axis, the plurality of first irradiation spotlights 301 are in positions in which a shortest distance between the plurality of first irradiation spotlights 301 and the central line is monotonically non-decreasing from front to rear in a movement direction in which the portions irradiated with the plurality of first irradiation spotlights, the plurality of second irradiation spotlights, and the plurality of third irradiation spotlights extend relative to wafer 100B, and the plurality of third irradiation spotlights 303 are aligned in one or more straight lines (here, one straight line). Here, the expression the "spotlights are in positions in which a shortest distance between the spotlights and the central line is monotonically non-decreasing" means the "spotlights are in positions in which a shortest distance between the spotlights and the central line increases or remains constant".

The following describes some not necessarily limiting specific examples of irradiation patterns of first irradiation spotlights 301 and second irradiation spotlights 302 in the forty-ninth process.

FIG. 11A to FIG. 11D are each a schematic enlarged plan view of wafer 100B illustrating an example of a state in which the upper surface of wafer 100B is irradiated with the second laser beam.

Figure 11A:
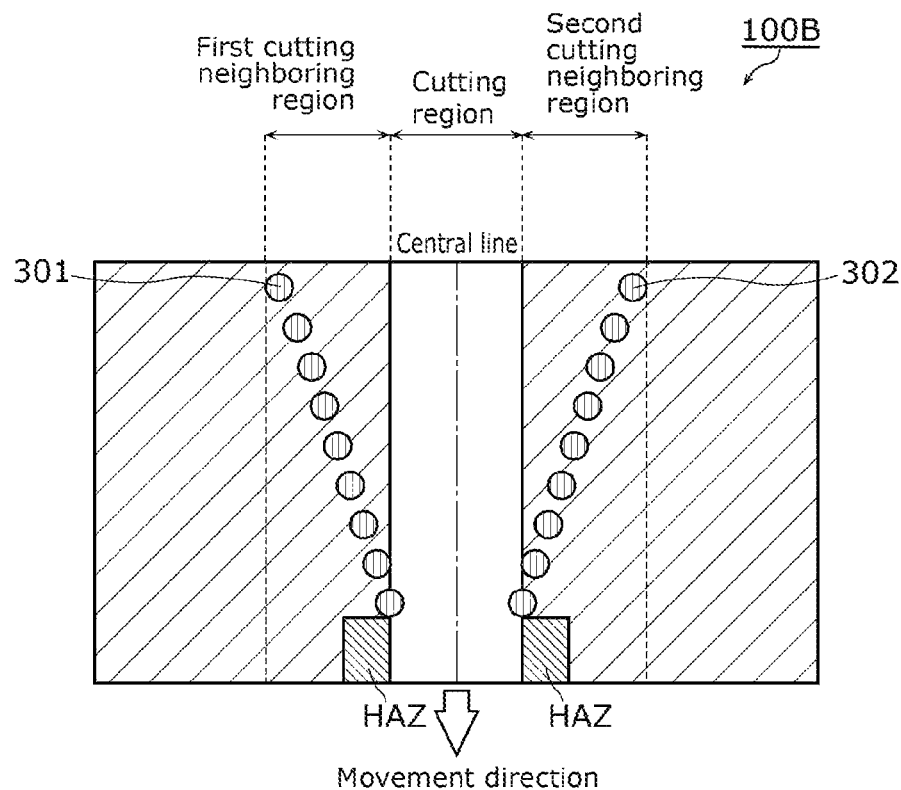
FIG. 11A is a schematic enlarged plan view illustrating an example of a state in which the upper surface of the wafer is irradiated with a second laser beam in the forty-ninth process according to Embodiment 3.

As illustrated in FIG. 11A, in the plan view of wafer 100B, first irradiation spotlights 301 may be aligned in one straight line, and second irradiation spotlights 302 may be aligned in one straight line.

Accordingly, the second laser beam can be prevented from being emitted on the same spot a plurality of times.

Figure 11B:
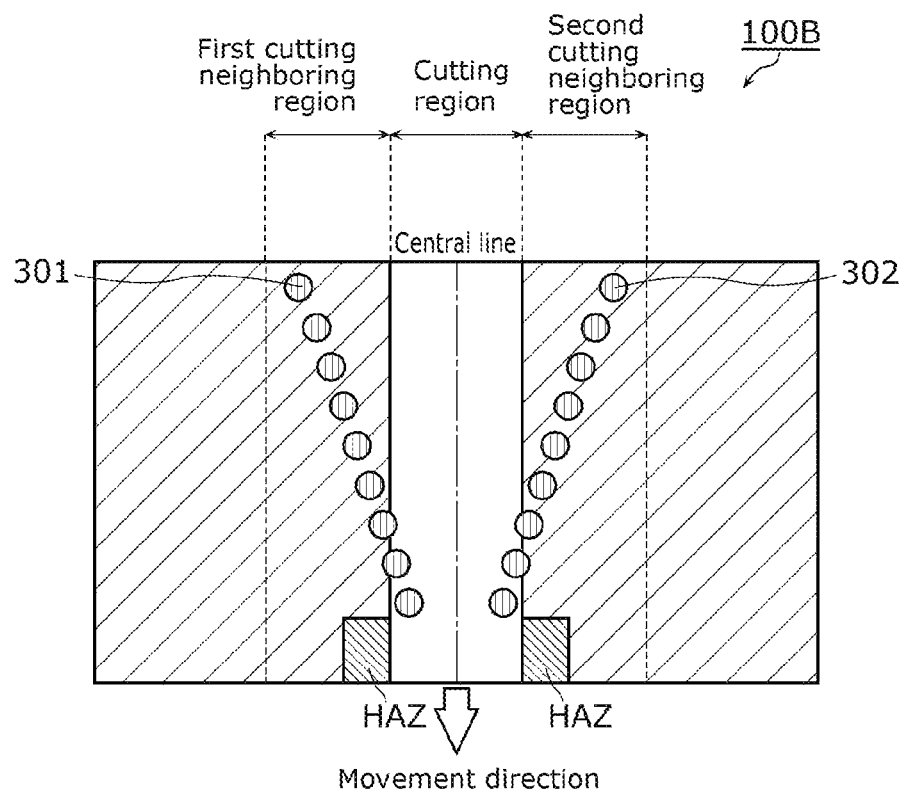
FIG. 11B is a schematic enlarged plan view illustrating an example of a state in which the upper surface of the wafer is irradiated with a second laser beam in the forty-ninth process according to Embodiment 3.

As illustrated in FIG. 11B, in the plan view of wafer 100B, at least one of first irradiation spotlights 301 may be positioned in the cutting region, and at least one of second irradiation spotlights 302 may be positioned in the cutting region.

Accordingly, even if a HAZ is formed in the cutting region due to variations in how well the resultant state after the processes is, the HAZ formed in the cutting region can be removed by irradiation with the second laser beam.

Figure 11C:
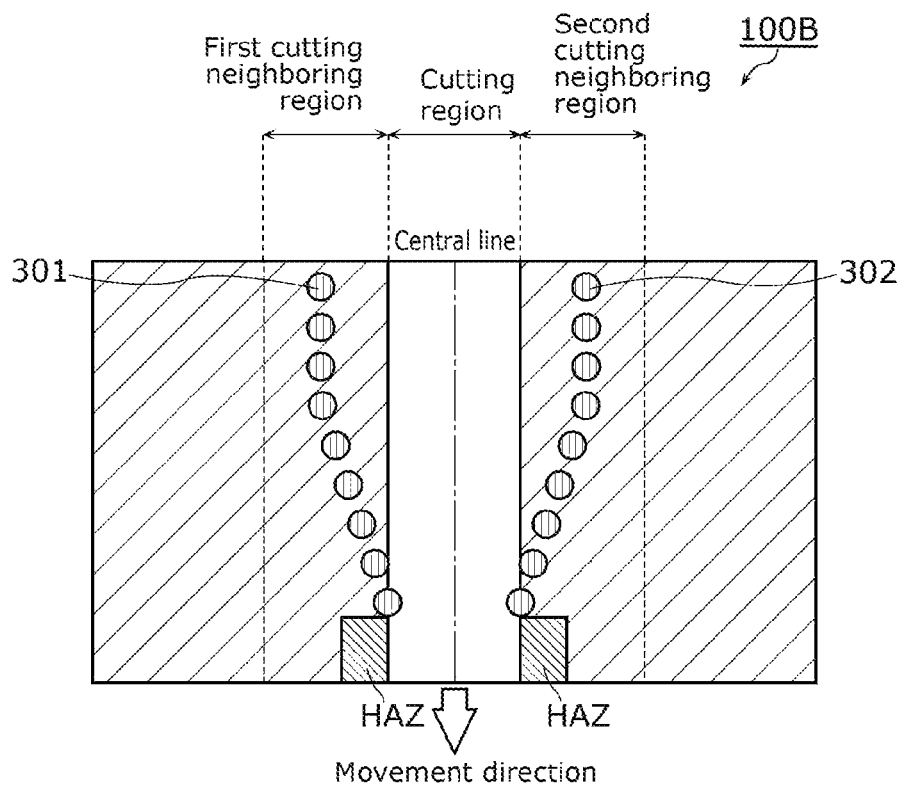
FIG. 11C is a schematic enlarged plan view illustrating an example of a state in which the upper surface of the wafer is irradiated with a second laser beam in the forty-ninth process according to Embodiment 3.
Figure 11D:
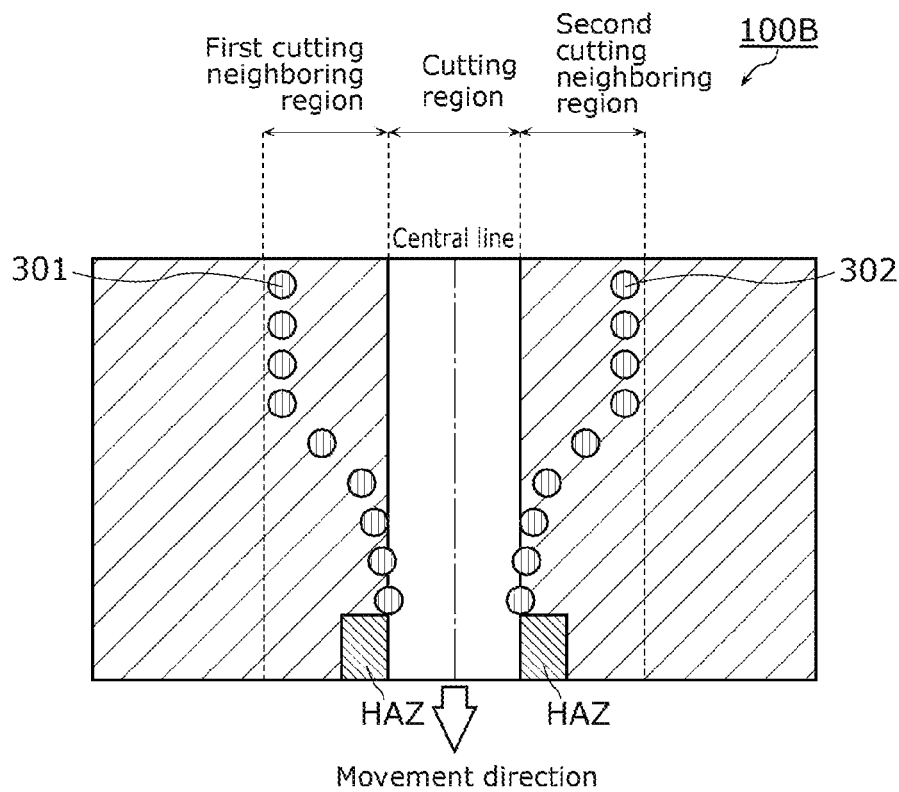
FIG. 11D is a schematic enlarged plan view illustrating an example of a state in which the upper surface of the wafer is irradiated with a second laser beam in the forty-ninth process according to Embodiment 3.

As illustrated in FIG. 11C and FIG. 11D, in the plan view of wafer 100B, first irradiation spotlights 301 may be aligned along two or more sides, and second irradiation spotlights 302 may be aligned along two or more sides.

Accordingly, the cutting neighboring regions can be prevented from being unnecessarily extended.

The following describes some not necessarily limiting specific examples of relationships of an irradiation pattern of first irradiation spotlights 301 and second irradiation spotlights 302 and an irradiation pattern of third irradiation spotlights 303 in the forty-ninth process.

As illustrated in FIG. 10, in the plan view of wafer 100B, at least one of the plurality of first irradiation spotlights 301 may be positioned ahead of the plurality of third irradiation spotlights 303 in the movement direction, and at least one of the plurality of second irradiation spotlights 302 may be positioned ahead of the plurality of third irradiation spotlights 303 in the movement direction.

Accordingly, a formation that contains metal included in metal layer 30 and is newly generated by the irradiation with the second laser beam can be removed by the third laser beam after such a formation becomes a burr that can be readily removed. Thus, the adhesion of such a burr can be reduced. Note that it is also effective to extend the width of the cutting inside region to the width of the cutting region and thereafter emit the third laser beam.

Figure 12C:
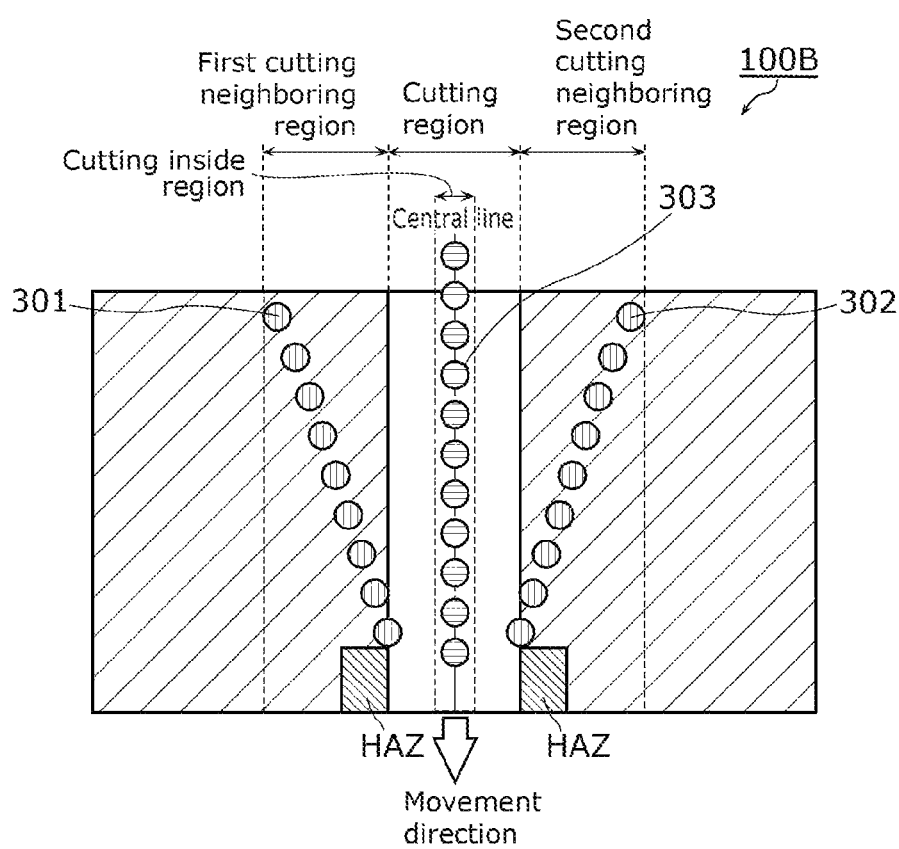
FIG. 12C is a schematic enlarged plan view illustrating an example of a state in which the upper surface of the wafer is irradiated with a second laser beam and a third laser beam in the forty-ninth process according to Embodiment 3.

FIG. 12A, FIG. 12B, and FIG. 12C are each a schematic enlarged plan view of wafer 100B illustrating another example of a state in which the upper surface of wafer 100B is irradiated with the second laser beam and the third laser beam in the forty-ninth process.

As illustrated in FIG. 12A, in the plan view of wafer 100B, at least one of the plurality of third irradiation spotlights 303 may be positioned ahead of the plurality of first irradiation spotlights 301 in the movement direction, and at least one of the plurality of third irradiation spotlights 303 may be positioned ahead of the plurality of second irradiation spotlights 302 in the movement direction.

Accordingly, irradiation with the third laser beam prior to the irradiation with the second laser beam can increase in advance the temperature of a region that is to be processed with the second laser beam, and thus metal layer 30 can be efficiently vaporized. Thus, the adhesion of such a burr can be reduced.

As illustrated in FIG. 12B, in the plan view of wafer 100B, third irradiation spotlights 303 may also be aligned in two straight lines.

Accordingly, such a burr as above can be more effectively removed.

As illustrated in FIG. 12C, in the plan view of wafer 100B, at least one of the plurality of third irradiation spotlights 303 may be positioned rear of the plurality of first irradiation spotlights 301 in the movement direction, and at least one of the plurality of third irradiation spotlights 303 may be positioned rear of the plurality of second irradiation spotlights 302 in the movement direction.

Accordingly, a formation that contains metal included in metal layer 30 and is newly generated by the irradiation with the second laser beam can be more effectively removed by the third laser beam. Thus, the adhesion of such a burr can be reduced.

As illustrated in FIG. 9C, the fiftieth process is a process of removing water-soluble protective layer 51B from the surface of wafer 100B using wash water. The fiftieth process is equivalent to the ninth process in the first chip singulation method according to Embodiment 1, in which wafer 100 is replaced with wafer 100B, semiconductor substrate 32 is replaced with semiconductor substrate 32B, low-concentration impurity layer 33 is replaced with low-concentration impurity layer 33B, oxide film 34 is replaced with oxide film 34B, water-soluble protective layer 51 is replaced with water-soluble protective layer 51B, and semiconductor layer 40 is replaced with semiconductor layer 40B.

[3-3. Consideration]

As described above, wafer 100B can be diced without using a blade according to the third chip singulation method.

Further, as described above, formation of a HAZ is reduced in the semiconductor device separated by the third chip singulation method. Thus, the third chip singulation method provides a semiconductor device in which formation of a HAZ is reduced.

(Supplement)

The above has described chip singulation methods according to aspects of the present disclosure, based on Embodiment 1 to Embodiment 3, yet the present disclosure is not limited thereto. The scope of one or more of the aspects also encompasses embodiments as a result of adding, to the embodiments, various modifications that may be conceived by those skilled in the art, and embodiments obtained by combining elements in different embodiments, as long as the resultant embodiments do not depart from the gist of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to, for instance, a semiconductor device in which a metal layer is formed at a bottom.

The invention claimed is:

1. A chip singulation method including dicing a wafer having an upper surface on which a plurality of semiconductor element structures are formed, the chip singulation method comprising, in stated order:
  a first process of thinning the wafer from an undersurface thereof;
  a second process of forming a metal layer on the undersurface of the wafer that has been thinned;
  a third process of cutting the wafer and the metal layer by irradiating a predetermined region of the upper surface of the wafer with a first laser beam; and
  a fourth process of irradiating cutting neighboring regions with a second laser beam and irradiating a cutting inside region with a third laser beam, the cutting neighboring regions lying, in a plan view of the wafer, in predetermined areas on sides of a central line of a cutting region in which the wafer and the metal layer are cut in the third process, the cutting inside region being included in the cutting region in the plan view of the wafer,
  wherein the first laser beam, the second laser beam, and the third laser beam are output from a single laser beam output device,
  in the plan view of the wafer, the cutting neighboring regions include:
    a first cutting neighboring region on one of the sides of the central line; and
    a second cutting neighboring region on an other of the sides of the central line, and in the fourth process, when the cutting neighboring regions are irradiated with the second laser beam, the first cutting neighboring region is irradiated with a plurality of first irradiation spotlights, and the second cutting neighboring region is irradiated with a plurality of second irradiation spotlights, the plurality of first irradiation spotlights resulting from a portion of a laser beam output by the single laser beam output device being split, the plurality of second irradiation spotlights resulting from a portion of a laser beam output by the single laser beam output device being split, when the cutting inside region is irradiated with the third laser beam, the cutting inside region is irradiated with a plurality of third irradiation spotlights resulting from a portion of a laser beam output by the single laser beam output device being split, in the plan view of the wafer, the plurality of first irradiation spotlights, the plurality of second irradiation spotlights, and the plurality of third irradiation spotlights are moved or the wafer is moved to extend, relative to the wafer, portions irradiated with the plurality of first irradiation spotlights, the plurality of second irradiation spotlights, and the plurality of third irradiation spotlights in a cutting direction of the cutting region, in the plan view of the wafer, the plurality of first irradiation spotlights and the plurality of second irradiation spotlights are axisymmetric in respect to the central line serving as a symmetric axis, in the plan view of the wafer, the plurality of first irradiation spotlights are in positions in which a shortest distance between the plurality of first irradiation spotlights and the central line is monotonically non-decreasing from front to rear in a movement direction in which the portions irradiated with the plurality of first irradiation spotlights, the plurality of second irradiation spotlights, and the plurality of third irradiation spotlights extend relative to the wafer, and in the plan view of the wafer, the plurality of third irradiation spotlights are aligned in one or more straight lines.

2. The chip singulation method according to claim 1, wherein in the plan view of the wafer, at least one of the plurality of first irradiation spotlights is positioned in the cutting region.

3. The chip singulation method according to claim 1, wherein in the plan view of the wafer, the plurality of first irradiation spotlights are aligned in one straight line.

4. The chip singulation method according to claim 1, wherein in the plan view of the wafer, the plurality of first irradiation spotlights are aligned along two or more sides.

5. The chip singulation method according to claim 1, wherein in the plan view of the wafer, at least one of the plurality of third irradiation spotlights is positioned ahead of the plurality of first irradiation spotlights in the movement direction.

6. The chip singulation method according to claim 1, wherein in the plan view of the wafer, at least one of the plurality of first irradiation spotlights is positioned ahead of the plurality of third irradiation spotlights in the movement direction.

7. The chip singulation method according to claim 1, wherein in the plan view of the wafer, at least one of the plurality of third irradiation spotlights is positioned rear of the plurality of first irradiation spotlights in the movement direction.

8. The chip singulation method according to claim 1, wherein in the plan view of the wafer, the plurality of third irradiation spotlights are aligned in two straight lines.

* * * * *